(12) United States Patent
Faraji et al.

(10) Patent No.: US 11,189,420 B2
(45) Date of Patent: Nov. 30, 2021

(54) NOISE SUPPRESSING ASSEMBLIES

(71) Applicant: NeoGraf Solutions, LLC, Lakewood, OH (US)

(72) Inventors: Parisa Faraji, Solon, OH (US); Seungyoung Kwak, Osan-si (KR); David Stuart, Columbia Station, OH (US); Bret Trimmer, Middlefield, OH (US); Greg Kramer, Twinsburg, OH (US)

(73) Assignee: NEOGRAF SOLUTIONS, LLC, Lakewood, OH (US)

( * ) Notice: Subject to any disclaimer, the term of this patent is extended or adjusted under 35 U.S.C. 154(b) by 581 days.

(21) Appl. No.: 16/089,171

(22) PCT Filed: Mar. 29, 2017

(86) PCT No.: PCT/US2017/024782
§ 371 (c)(1),
(2) Date: Sep. 27, 2018

(87) PCT Pub. No.: WO2017/172939
PCT Pub. Date: Oct. 5, 2017

(65) Prior Publication Data
US 2020/0328025 A1 Oct. 15, 2020

Related U.S. Application Data

(60) Provisional application No. 62/353,093, filed on Jun. 22, 2016, provisional application No. 62/316,527, filed on Mar. 31, 2016.

(51) Int. Cl.
*H01F 27/36* (2006.01)
*H02J 50/12* (2016.01)
(Continued)

(52) U.S. Cl.
CPC ........... *H01F 27/36* (2013.01); *C01B 32/225* (2017.08); *C08K 3/04* (2013.01); *H01F 27/22* (2013.01);
(Continued)

(58) Field of Classification Search
CPC .......... H01F 27/36; H01F 27/22; H01F 38/14; H02J 50/12; H02J 50/70; H02J 50/005; C01B 32/225; C08K 3/04
See application file for complete search history.

(56) References Cited

U.S. PATENT DOCUMENTS 3,404,061 A 10/1968 Shane
3,627,551 A 12/1971 Olstowki
(Continued)

FOREIGN PATENT DOCUMENTS

CN 101512677 8/2009
CN 104029461 9/2014
(Continued)

OTHER PUBLICATIONS

Luo, X, et al. "Electronic Applications of Flexible Graphite", Journal of Electronic Materials, vol. 31, No. 5 2002.
(Continued)

*Primary Examiner* — Daniel C Puentes
(74) *Attorney, Agent, or Firm* — Calfee, Halter & Griswold LLP

(57) ABSTRACT

Assemblies having multi-functionalities of any combination of heat spreading, absorption of stray radiation, signal focusing, and shielding are provided. The assemblies may include a heat spreading layer of at least one sheet of a compressed particles of exfoliated graphite, graphitized polymers and combinations thereof. The assemblies may also include at least one magnetic layer, which may provide the benefits of magnetic flux management and/or stray
(Continued)

radiation absorption. The assemblies may include an optional plastic coating on one or both of the exterior surfaces. The assemblies may be used to enable fast wireless charging of electronic devices by efficiently focusing magnetic flux for better power transmission efficiency.

10 Claims, 14 Drawing Sheets

(51) Int. Cl.
| | |
|---|---|
| H02J 50/70 | (2016.01) |
| C01B 32/225 | (2017.01) |
| H02J 50/00 | (2016.01) |
| C08K 3/04 | (2006.01) |
| H01F 27/22 | (2006.01) |
| H01F 38/14 | (2006.01) |

(52) U.S. Cl.
CPC ............ *H01F 38/14* (2013.01); *H02J 50/005* (2020.01); *H02J 50/12* (2016.02); *H02J 50/70* (2016.02)

(56) References Cited

U.S. PATENT DOCUMENTS

| | | | |
|---|---|---|---|
| 3,991,248 | A | 11/1976 | Bauer |
| 4,878,152 | A | 10/1989 | Sauzade |
| 5,100,737 | A | 3/1992 | Colombier |
| 5,718,811 | A | 2/1998 | Chen et al. |
| 5,780,820 | A | 7/1998 | Komyoji |
| 5,910,524 | A | 6/1999 | Kalinoski |
| 6,027,807 | A | 2/2000 | Ilnoue |
| 6,139,942 | A | 10/2000 | Hartness |
| 6,280,663 | B1 | 8/2001 | Shao |
| 6,395,220 | B1 | 5/2002 | Lewis |
| 6,440,563 | B2 | 8/2002 | Shao |
| 6,652,958 | B2 | 11/2003 | Tobita |
| 6,803,108 | B2 | 10/2004 | Lewis |
| 6,887,412 | B1 | 5/2005 | Ono |
| 7,005,573 | B2 | 2/2006 | Lionetta |
| 7,089,995 | B2 | 8/2006 | Koscheyev |
| 7,105,108 | B2 | 9/2006 | Kaschak |
| 7,172,785 | B2 | 2/2007 | Thompson |
| 7,323,214 | B2 | 1/2008 | Wakayama |
| 7,425,604 | B2 | 9/2008 | Cosman |
| 7,561,114 | B2 | 7/2009 | Maezawa |
| 7,790,285 | B2 | 9/2010 | Zhamu |
| 7,799,428 | B2 | 9/2010 | Fujiwara |
| 8,106,128 | B2 | 1/2012 | Cosman |
| 8,119,191 | B2 | 2/2012 | Bunyan |
| 8,501,318 | B2 | 8/2013 | Jang |
| 8,501,858 | B2 | 8/2013 | Drzal |
| 8,541,976 | B2 | 9/2013 | Arai |
| 8,696,938 | B2 | 4/2014 | Zhamu |
| 8,766,108 | B2 | 7/2014 | Bunyan |
| 8,878,393 | B2 | 7/2014 | Bunyan |
| 8,847,184 | B2 | 9/2014 | Cheng |
| 8,957,549 | B2 | 2/2015 | Kesler |
| 9,017,570 | B2 | 4/2015 | Kwak |
| 9,112,364 | B2 | 8/2015 | Partovi |
| 9,178,369 | B2 | 11/2015 | Partovi |
| 9,852,844 | B2 | 12/2017 | Goiko |
| 9,894,817 | B2 | 2/2018 | Kagawa |
| 2003/0044614 | A1 | 3/2003 | Norley |
| 2004/0241397 | A1 | 12/2004 | King |
| 2007/0012900 | A1 | 1/2007 | Callen |
| 2007/0252771 | A1 | 11/2007 | Maezawa |
| 2009/0107972 | A1 | 4/2009 | Naylor |
| 2011/0053052 | A1 | 3/2011 | Braun |
| 2011/0114342 | A1 | 5/2011 | Ono et al. |
| 2011/0135884 | A1 | 6/2011 | Lettow |
| 2012/0112553 | A1 | 5/2012 | Stoner |
| 2012/0133072 | A1 | 5/2012 | Bunyan |
| 2012/0142832 | A1 | 6/2012 | Varma et al. |
| 2012/0236528 | A1 | 9/2012 | Le |
| 2013/0038280 | A1 | 2/2013 | Boundy |
| 2013/0200296 | A1 | 8/2013 | Song |
| 2013/0207005 | A1 | 8/2013 | Cheng |
| 2013/0213630 | A1 | 8/2013 | Southard, II |
| 2013/0224023 | A1 | 8/2013 | Kim |
| 2013/0265722 | A1 | 10/2013 | Hill |
| 2013/0299732 | A1 | 11/2013 | Kwak |
| 2013/0309396 | A1 | 11/2013 | Legare |
| 2014/0002017 | A1 | 1/2014 | Kim |
| 2014/0077758 | A1 | 3/2014 | Kaushik |
| 2014/0124906 | A1 | 5/2014 | Park |
| 2014/0124907 | A1 | 5/2014 | Park |
| 2014/0146477 | A1* | 5/2014 | Youn ...................... B32B 9/007 361/705 |
| 2014/0182924 | A1 | 7/2014 | Misra |
| 2014/0238736 | A1 | 8/2014 | Youm |
| 2015/0123860 | A1 | 5/2015 | Park |
| 2015/0270717 | A1* | 9/2015 | Fujimaki ................. H02J 50/70 307/10.1 |
| 2016/0297383 | A1 | 10/2016 | Pike |
| 2017/0354190 | A1 | 12/2017 | Cauchy |

FOREIGN PATENT DOCUMENTS

| | | |
|---|---|---|
| EP | 2869398 | 9/2020 |
| JP | 3184484 | 7/2001 |
| JP | 2005229100 | 2/2005 |
| JP | 2009108118 A | 5/2009 |
| KR | 136704 | 12/2008 |
| KR | 10-1287574 | 7/2013 |
| KR | 20150115055 A | 10/2015 |
| WO | 2006125045 | 11/2006 |
| WO | 2007123645 | 3/2007 |
| WO | 2009158045 | 12/2009 |
| WO | 2013105757 | 7/2013 |
| WO | 2013138265 | 9/2013 |
| WO | 2013164818 | 11/2013 |
| WO | 2014061048 | 11/2013 |
| WO | 2014186452 | 11/2014 |
| WO | 2015148498 | 11/2014 |
| WO | 2015031061 A1 | 3/2015 |
| WO | 2016077843 | 5/2016 |

OTHER PUBLICATIONS

Gaier, J.R., et al. "EMII Shields Made from Intercalated Graphite Composites" NASA Technical Memorandum 10979, Seventh International Materials and Processing Center Society for Acvancement of Materials Processing Parsippany, NJ, Jun. 21-23, 1994.
Partial Supplementary European Search Report for European Patent Application No. 17776561.7 dated Aug. 9, 2019.

* cited by examiner

NOISE SUPPRESSING ASSEMBLIES

TECHNICAL FIELD

The disclosed embodiments in general relate to EMI (Electromagnetic Interference) shielding assemblies, also referred to as articles, particular non-limiting examples include an assembly having a graphite substrate and a coating or element with EMI shielding properties (EMI shielding includes noise suppression/mitigation and/or absorption or signal focusing) in addition to a heat spreading, in a single unitary component to provide the benefit of both shielding and thermal management.

BACKGROUND

In the case of wireless power transfer (can also be referred to as wireless charging if a load is present on the receiver side), power transfer can occur in two major forms, inductive and resonant. In the case of inductive power transfer, the transmitter coil (Tx) induces a magnetic field which extends to the receiver coil (Rx) and the alternating magnetic field generates current within the receiver coil (Rx). In an ideal situation, all the transmitted power from the Tx is received by the Rx resulting in perfect power transfer, however there are usually losses in the transmission due to various factors including coupling efficiency, distance between the coils etc. This loss of energy is typically converted into heat and is more readily observed in lightly coupled systems as opposed to a more tightly coupled system. Coupling is generally dictated by the size(s) of the Tx and Rx, their alignment with each other and the distance between the coils. In case of resonant transferred power between coils operating at (identical) resonant frequencies (determined by the coils' distributed capacitance, resistance and inductance). The technique is still "inductive" in that the oscillating magnetic field generated by the primary coil induces a current in the secondary but it takes advantage of the strong coupling that occurs between resonant coils—even when separated by tens of centimeters. Resonant wireless charging addresses the main drawback of inductive wireless charging; the requirement to closely couple the coils which demands precise alignment from the user, although it has its own drawbacks such as lower efficiency and potential chances of electromagnetic interface due to flux leakage. Excess heat generation is an important issue in small and compact electronics during wireless charging, which is highly dependent on location of receiving coil. In a case where a receiving coil is placed in close contact/proximity with a battery, without a magnetic sheet/solution with adequate magnetic shielding property, high frequency magnetic flux will reach the battery case passing through the sheet. As battery cases are generally made of aluminum, high frequency magnetic flux generates eddy-current over the case, causing not only a decline in power transmission efficiency due to iron loss, but also a risk of abnormal heating. An unfailing, safe magnetic shield is required especially on the receiving coil side under the magnet alignment method. This is for additional magnetic flux from the magnets, along with high frequency magnetic flux being transmitted from the transmission coil, which must be absorbed and shielded. As the wireless charging markets grow and expand into more devices, it is imperative that systems are designed where tightly coupled configurations may not always be possible. This demands greater flexibility in terms of coil alignment, distance between the coils, sizes of the coils etc.

Electromagnetic interference ("EMI") generally refer to both electromagnetic interference and radio frequency interference ("RFI") emissions. Many modern electronic devices emit or are sensitive to electromagnetic interference (EMI) at high frequencies. Electromagnetic interference is the undesired conducted or radiated electromagnetic disturbances from an electric or electronic apparatus, including transients, which can interfere with the operation of other electrical or electronic apparatus or itself. Such disturbances can occur anywhere in the electromagnetic spectrum.

BRIEF DESCRIPTION

An embodiment described herein includes an assembly that may have multi-functionality of any combination of heat spreading, absorption of stray radiation, signal focusing, and shielding. An embodiment of the assembly has a thickness of no more than 500 microns. The assembly may include a heat spreading layer comprised of at least one sheet of a compressed particles of exfoliated graphite, graphitized polymers and combinations thereof. The heat spreading layer may have an in-plane thermal conductivity of at least about 300 W/mK up to about 2,100 W/mK. The thickness of the heat spreading layer may range from 17 microns up to about 250 microns. The assembly may also include a magnetic layer, which may provide the benefits of magnetic flux management and/or stray radiation absorption. The magnetic layer may have a thickness of no more than about 300 microns. In an embodiment, the magnetic layer may comprise no more than sixty percent by weight (60% pbw) of iron, no more than sixty percent by weight (60% pbw) of nickel, no more than fifteen percent by weight (15% pbw) of binder and no more than twenty percent by weight (20% pbw) for the combination of elements of chromium, silicon and molybdenum. Lastly, the assembly may include an optional plastic coating on one or both of the exterior surfaces of the assembly. This assembly may be used to enable fast wireless charging of mobile devices by efficiently focusing magnetic flux for better power transmission efficiency, as well as managing noise generation. The assembly may be disposed in a device adjacent the induction coil for wireless charging. Such coil is typically proximate a back or intended bottom surface of the device.

Another embodiment described herein includes a second assembly that may have multi-functionality of any combination of heat spreading, broadband electric field shielding, and electromagnetic noise mitigation. Preferably the assembly has a thickness of no more than 500 microns. The assembly may include a heat spreading layer comprised of at least one of compressed particles of exfoliated graphite, graphitized polymers and combinations thereof. The heat spreading layer may have an in-plane thermal conductivity of at least about 250 W/mK up to about 2,100 W/mK. The thickness of the heat spreading layer may range from 10 microns up to about 1,000 microns. The assembly may also include a noise suppression component. Examples of the noise suppressing component may include an electrically conductive wire mesh. Suitable materials for the wire mesh may include aluminum, brass, columbium, copper, gold, Inconel, nickel, nickel alloys, phosphor, bronze, platinum, silver, stainless steel, low carbon steel, tantalum, titanium, zinc, zirconium, Polyether ether ketone (PEEK), PTFE, PFA, ECTFE, polypropylene, polyethylene, PET (such as but not limited to Mylar® a registered trademark of DuPont) and combinations thereof. Lastly, the assembly may include an optional plastic coating on one or both of the exterior surfaces of the assembly. Such second assembly may be disposed in a device around an electronic component that is desired to be shielded from stray electrical signals, around an electronic component that is desired to not transmit electrical signals to other electronic components in the device, and combinations thereof.

Thirdly, embodiments are directed to composite electrically conductive shielding solutions adapted for placement between and compressed by adjacent interface surfaces to provide highly conductive path between mating surfaces. The electrical conductivity between the surfaces is necessary for proper electromagnetic interface mitigation and grounding. Theses surfaces can form an enclosure for sensitive electronics packaging, an external avionics package or an antenna mount. The conductive path can be selective through the z direction or adjusted along regions.

Articles described herein can also provide broadband electromagnetic shielding. The hybrid solution has a resilient structure and efficient low frequency shielding due to electrically conductive mesh and high frequency shielding and heat spreading due to graphite composite that results in a broadband (KHz-100 GHz) electromagnetic shielding solution in conjunction with thermal management.

DETAILED DESCRIPTION OF EMBODIMENTS

Metals widely used as thermal solutions will effectively block all wireless radiation coupling that is needed to initiate and maintain charging, thus preventing technological evolution. Advantageously, graphite, such as natural graphite or synthetic graphite made from graphitized polymers provides thermal solutions by effectively conducting heat while not affecting the wireless transmission of energy to the device's battery at the frequencies needed for charging. Another potential advantage of graphite is that it may reflect a signal thereby inhibiting the signal to pass to other internal electronics in a device. Applications for such graphite assemblies may be in conjunction with either of the transmitting coil, the receiving coil, signal transmitting components, signal receiving components and any combination thereof.

Shielding Solution

An embodiment disclosed herein includes a magnetic shielding assembly to prevent high frequency magnetic flux from reaching metal cases or components such as a battery. The magnetic sheet assembly prevents the generation of eddy-currents over the metal case which causes undesirable heating and power loss. An assembly providing a magnetic solution to shield metal parts from transmitting and receiving coils is beneficial in miniature compact electronics.

A particular embodiment is an electric field shield assembly to suppress transmission of undesired signals across slots, openings, and joints.

Another embodiment may be a conductive moldable structure which forms a shielding enclosure or faraday cage to enclose sources of interface from transmitting to outside sensitive components or vice versa. Shielding enclosure has varied attenuation depending on wave form, frequency or distance from receiver/transmitter, and receiver/transmitter power. On the other hand composite conductive shield attenuation and frequency can be varied by metal type and mesh openings.

A solution, as described herein, may have radio frequency (RF) absorption properties in addition to intrinsic EMI shielding and thermal properties of flexible graphite, which is instrumental for today's noise issues. In an embodiment, flexible graphite (heat spreader material) is an excellent shield for electric/plane wave and by combining it with magnetic particles, it can be utilized for magnetic attenuation as well.

Figure 1:
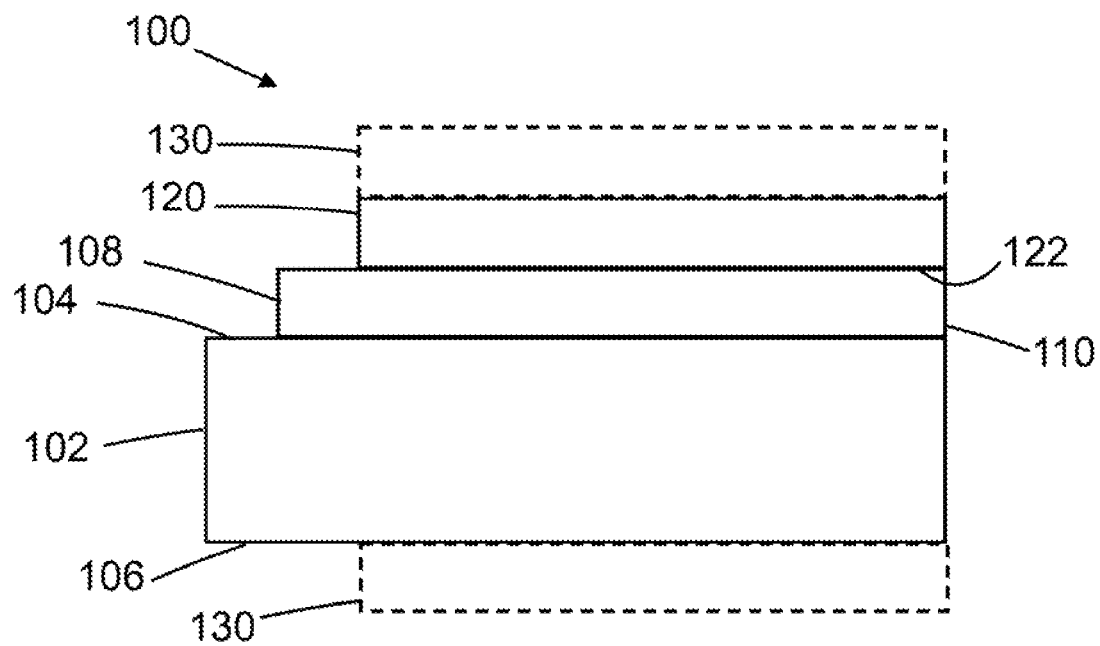
FIG. 1 is a side view of the assembly as described herein.

With reference now to FIG. 1 an embodiment of an assembly, also referred to as an article, is shown and generally designated by the reference numeral 100. The assembly 100 can absorb electromagnetic radiation, can act as a magnetic flux managing layer, and also act as a heat spreader as described herein. It should be noted that for the sake of clarity not all the components and elements of the assembly 100 may be shown and/or marked in all the drawings. Also, as used in this description, the terms "up," "down," "top," "bottom," etc. refer to assembly 100 when in the orientation shown in FIG. 1. However, the skilled artisan will understand that assembly 100 can adopt any particular orientation when in use.

As shown in FIG. 1 the assembly 100 includes a graphite substrate 102 comprising one or more sheets of graphite. The graphite sheet(s) 102 can be compressed particles of exfoliated graphite, a graphitized polymer or combinations thereof. The graphite substrate 102 may have a density of at least 0.6 g/cc up to 2.2 g/cc (including all points in between). In one example, the graphite substrate has a thickness of at least about 25 microns, in another example, the graphite substrate has a thickness of up to about 250 microns and in a further example, the graphite substrate has a thickness ranging from about 50 microns to about 200 microns, and in a further example, the graphite substrate has a thickness ranging from about 100 microns to about 200 microns. If so desired, graphite substrate 102 may have a thickness in the range of about 250 microns to about 20 microns.

If so desired, the graphite substrate may include one or more additives such as a perforated metal layer, metal mesh (preferably steel, stainless steel, copper, silver nanowire, bronze, brass and/or aluminum), nickel foam, oriented carbon fibers, carbon fibers, carbon nanotubes, carbon nanostructures, nickel coated graphite p assemblies, graphene particles and any combination thereof. Sources of one or more of the additives may include Novamet or Applied Nanostructured Solutions. Though not shown, if so desired, either of the metal layer or the metal mesh may extend beyond one of more of the edges of graphite substrate 102. Exemplary sizing may include$_{[SDJ1]}$ 100-350 mesh, USA standard for mesh sizes. In terms of a mesh opening dimensions, an example of a suitable opening sizes in 0.006 inches or less.

The graphite substrate 102 has a first side 104 and a second side 106. The assembly 100 further may include a coated region 108 including a magnetic coating 110 forming a magnetic flux managing layer located on at least one side of the graphite substrate 102. In embodiments disclosed herein, managing the magnetic flux includes directing the power transfer from the power sources to the receiving coil of the wireless device. An aspect of managing the magnetic flux may include the avoidance or minimizing of the effects of unwanted coupling, such as coupling to a component other than the receiver induction coil. This aspect of managing the magnetic flux may include shielding the magnetic flux from electrically conductive components of the device that are not the receiver induction coil. Such assembly may have the benefit of shielding unwanted eddy currents, which undesirably can create magnetic fields in a reverse direction towards the power source. It is not uncommon for the unwanted magnetic fields to cause heating of the component which it's coupled to, resulting in the heating of the component and thereby creating detrimental noise current loops.

Figure 2:
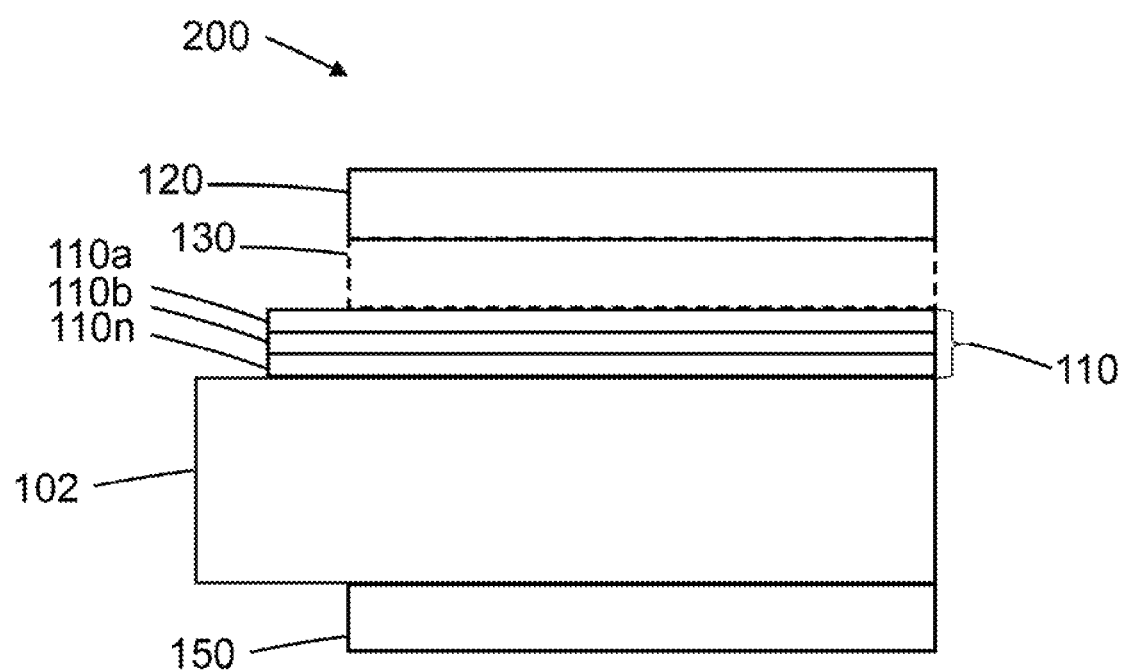
FIG. 2 is a side view of another example of the assembly as described herein.

The magnetic coating 110 may have a thickness of at least 40 microns and no more than about 300 microns. In one example, the thickness of the magnetic coating 110 is about 80 microns to about 250 microns thick. In another example, the thickness of the magnetic coating 110 is about 100 microns to about 200 microns thick. In another example, the magnetic coating 110 is about 125 microns to about 180 microns thick. The magnetic coating 110 may include a plurality of coating layers 110a-110n as shown in FIG. 2.

In a further embodiment, an overall thickness of the graphite substrate 102 and the coating region 108 including the magnetic coating 110 is preferably less than 350 microns, more preferably less than 325 microns, even more preferably no more than 300 microns. If desired, a thickness of less than 300 microns to as low as 105 microns is contemplated herein.

In one particular embodiment, coated region 108 includes at least two (2) layers. The first layer may comprise a mixture of 25-75% by weight of magnetic shielding composition and 75-25% by weight of an absorbing compound. In a particular embodiment, the first layer may include 40-60% by weight of the magnetic shielding composition and 60-40% by weight of the absorbing compound. An example of a magnetic shielding composition may include iron, aluminum and/or silicate. The particles may have a random orientation. An exemplary absorbing compound may include iron silicide and the particles may be uniformly shaped, e.g., at least substantially spherical. Each layer that makes up the coated region may have the same thickness or each layer may have a different thickness. Preferably, each layer which makes up the coated region has a thickness of at least 25 microns.

Another particular embodiment for magnetic coating 110 may include at least 85% iron, more preferably at least 88% iron, even more preferred at least 90%(+) of iron. The coating may also have less than 5% binder, more preferably no more than 4% binder, even further more preferred less than 4% binder. The coating may also have less than 7% silicon, less than 4%, less than 2%, a silicide being an example of the silicon containing compound in the absorber. In another example an absorber Vitrolam Material from VAC Vacuumschmelze is used. The VAC material can include up to 7% of a rare earth magnet.

Another particular embodiment for magnetic coating 110 may include no more than sixty percent by weight (60% pbw) of iron; preferably between sixty to twenty-five percent by weight (60-25% pbw), no more than sixty percent by weight (60% pbw) of nickel, preferably between sixty to twenty-five percent by weight (60-25% pbw), no more than fifteen percent (15% pbw) of binder, preferably less than ten percent by weight (10% pbw), even more preferred five percent by weight (5%) or less, and no more than twenty percent by weight (20% pbw) for the combination of elements of chromium, silicon and molybdenum, preferably no more than ten percent by weight (10% pbw), even more preferably five (5% pbw) percent or less.

In a further particular embodiment, the overall combination of the graphite layer and the signal focusing layer (AKA coating 110) may include 20-45% by weight of iron, preferably 20-40% by weight of iron, 15-35% by weight of graphite, 5-20% by weight of plastic, no more than 10% by weight of binder and up to 15% by weight of any combination of chromium, silicon and molybdenum. Preferably, the plastic may be in the form of a layer on each of the exterior surfaces of the combination of the graphite 102 and magnetic coating 110.

Sources of material for the magnetic coating 110 may include loading powders such as one or more of the following: Fe-based alloys, such as ferro-magnetic material, such as the following ferrous compounds: ferro-magnetic stainless (Fe—Cr—Al—Si alloy), sendust (Fe—Si—Al alloy)

based loading powder, permalloy (Fe—Ni alloy), silicon copper (Fe—Cu—Si alloy), Fe—Si alloy, Fe—Si—B (—Cu—Nb) alloy, Fe—Ni—Cr—Si alloy, Fe—Si—Cr alloy and Fe—Si—Al—Ni—Cr alloy. Moreover, ferrite or pure iron powder may be used. Amorphous alloys (Co-based, Fe-based, Ni-based and the like), electromagnetic soft iron and Fe—Al-based alloys may be used as well. These may be in the form of oxides, or may have an oxidized structure. With respect to the ferrite, examples thereof include soft ferrite, such as Mn—Zn ferrite, Ni—Zn ferrite, Mn—Mg ferrite, Mn ferrite, Cu—Zn ferrite and Cu—Mg—Zn ferrite, or hard ferrite e.g., a material used for permanent magnets. With respect to the Co-based oxides (Co—Zr—O-based, Co—Pb—Al—O-based and the like), granular films may be used. With respect to the Fe pure ferrite p assemblies, for example, carbonyl iron powder may be used. Alternative embodiments to the ferro-compounds would be compounds which include niobium (Nb) in place of or in conjunction with iron. Optionally in addition to the above, magnetic coating 110 may include carbon fibers, carbon nanotubes, carbon nanostructures, nickel coated graphite p assemblies, graphene particles and any combination thereof.

With respect to the shape, the magnetic materials may be spherical shape, flattened shape, fiber shape, flake shape and combinations thereof. Although not particularly limited, magnetic materials having a flattened shape with high permeability are one preferred embodiment.

An example of an average p assembly size of the magnetic powder or the major diameter of the flattened shaped magnetic powder is preferably set in a range from 1 to 300 microns preferably, from 20 to 100 microns. In one example, the aspect ratio of the magnetic materials having a flattened shape is preferably set in a range from 2 to 500, preferably, from 10 to 100. One or more of the flakes of iron in the coating 110 may have an aspect ratio of at least 50 up to an aspect ratio of 250. Examples of preferred ranges of aspect ratios are 70-230, 80-220, 90-180 or any combination thereof.

Examples of sources of the magnetic material may include ESPI Metals, Mu Metals, Micromod Partikel Technologies GmbH, Stewards, Sigma Aldrich, Circle Sage, Epson Atmix or Powder Processing Technologies LLC.

In another example, the coating 110 can include nickel in the form of an additive such as dendritic nickel powder or nickel flake. The dendritic nickel powder or nickel flake may have a large aspect ratio. In one example, the aspect ratio for flake size is about at least 15:1, preferably at least 20:1 or higher; one range of specific examples includes 22:1 to 26:1.

Alternatively, the addition of the nickel may be to the graphite and it can occur just after the smoothing roll on the calendaring line. This enables the material to be evenly spread onto the top surface of the material after which a subsequent calendaring roll compresses the material mechanically incorporating the nickel into the graphite. In another example, nickel is added to the bed of exfoliated graphite particles prior to compression. In an additional alternate example, nickel may be added to synthetic graphite. The resulting materials have an increased shielding effectiveness and improved in-plane thermal conductivity as compared to conventional EMI/ESD materials.

Other potential methodologies which may be used to incorporate the nickel into the graphite sheet may include a polymer binder, or vacuum filtration of ultra-sonicated suspensions of exfoliated graphite.

In one example, volume loading of 30% or more for the magnetic filler is added to the graphite. In further examples, volume loading of 25% or more for the magnetic filler is used. In other examples, volume loading of 20% or more for the magnetic filler is used. In other examples, volume loading of 10% or more for the magnetic filler is used.

Regarding the binder, examples of the binder may include an elastomer or a resin; a with respect to the elastomer, examples thereof include various elastomers (including thermoplastic elastomers), such as polyvinyl chloride-based elastomers, like polyethylene chloride, polystyrene-based, polyolefin-based, polyurethane-based, polyester-based, polyamide-based, fluorine-based and silicone-based elastomers.

With respect to the resin, examples thereof include: thermoplastic resins or thermosetting resins, such as polyester-based urethane resins (adipate-based, carbonate-based, and caprolactam ester-based resins), polyether-based urethane resin, polyvinyl acetal resin, polyethylene, polypropylene, AS resins, ABS resins, polystyrene, polyvinyl chloride, polyvinylidene chloride, polyvinyl acetate, ethylene-vinyl acetate copolymer, fluororesins, acryl-based resins, nylon, polycarbonate, polyethylene terephthalate, alkyd resins, unsaturated polyester, polysulfone, polyurethane resin (all the types except for those of the above-mentioned of polyester-based and polyether-based), phenolic resins, urea resins, epoxy resins, silicone resins, melamine resins, acrylic resins, acryl-based copolymer-based resins and alkyl acrylic-based resins. One of these elastomers or resins may be used alone, or those subjected to a modifying treatment (graft, copolymerizing, or chemical treatment) may be used, or those of composite-based (blended, polymer alloy, composite or the like) may be used. These may be blended in acrylic silicone, acrylic urethane, acrylic lacquer, various primers, fluorine-based paints, silicone-based paints and UV paints. If desired, a functional group (polar group, such as glycidyl group, carboxyl group, sulfonic acid group, maleic acid group and amino group, for example, polar group that forms an ionomer by the use of a metal salt, a quaternary amine or the like) may be added to the elastomers or resins.

The assembly 100 may further include an induction coil 120. The induction coil 120 is capable of receiving a signal having a frequency of at least about 80 kHz up to about 8 GHz. Examples can include an induction coil 120 being capable of receiving a signal having a frequency of 50-350 KHz, other examples include a frequency of 6 MHz to 14 MHz and other examples include a frequency of 2.4 GHz to 2.5 GHz.

In at least one example, the induction coil 120 includes an inwardly facing surface 122 disposed adjacent the magnetic coating 110 as shown in FIG. 1.

The combination of the graphite substrate 102 and the coated region 108 may have a protective coating, shown in dashed line at 130, on one (1) or both sides of the combination of graphite 102 and coating 110. In at least one example, the protective coating 130 can be disposed adjacent the magnetic coating 110, being located between coating 110 and induction coil 120, as shown in FIG. 1. In at least one other example, the protective coating 130 can be disposed adjacent the induction coil 120, such that the induction coil is disposed between the protective coating 130 and the magnetic coating 110, as shown in FIG. 2.

The coated region 108 may preform one or more of the following functions: absorbing stray radiation, and managing magnetic flux of intended signals to induction coil 120.

Figure 3:
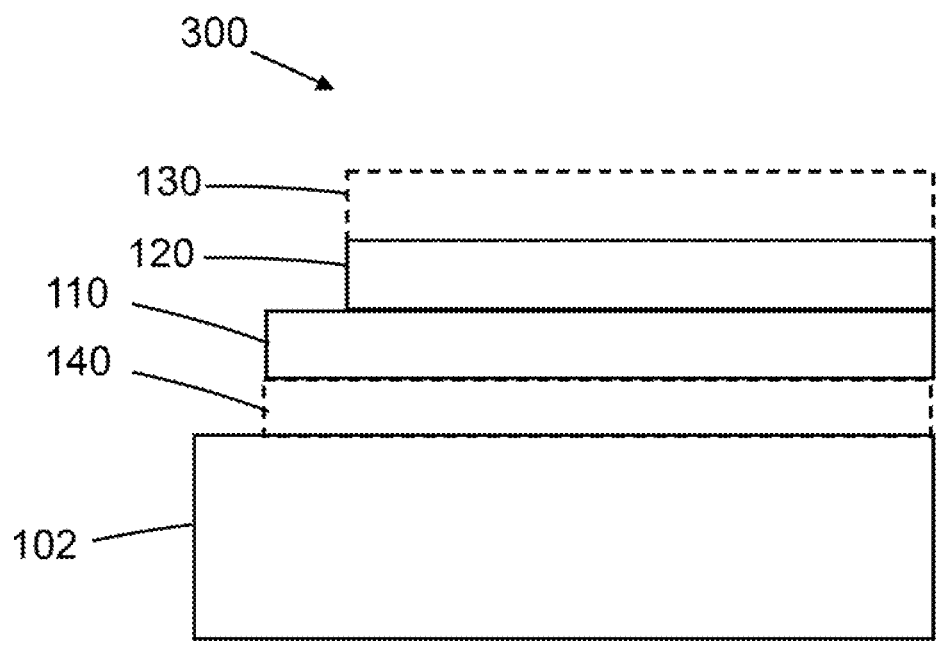
FIG. 3 is a side view of another example of the assembly as described herein.

An optional insulation layer, shown in dashed line at 140, can be disposed between the substrate 102 and the magnetic coating 110 as shown in FIG. 3.

Figure 4:
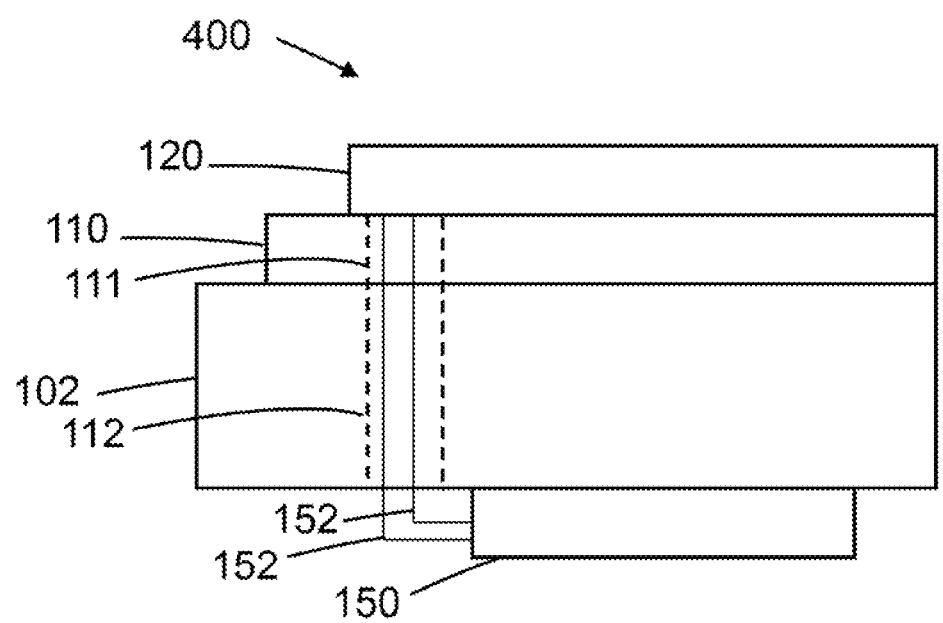
FIG. 4 is a side view of another example of the assembly as described herein.

A battery 150 or other electronic components can be located on a side of the substrate 102 opposite the coil 120, as shown in FIGS. 2 and 4. In one example, the substrate 102 includes a cutout 112 and the coating 110 includes a cutout 111 for accommodating electric leads 152 which extend between the coil 120 and the battery 150 as shown in FIG. 4.

As for the batteries disclosed herein, in one embodiment, the battery is capable of receiving at least 10 W/hr, preferably at least 50 W/hr.

Figure 5:
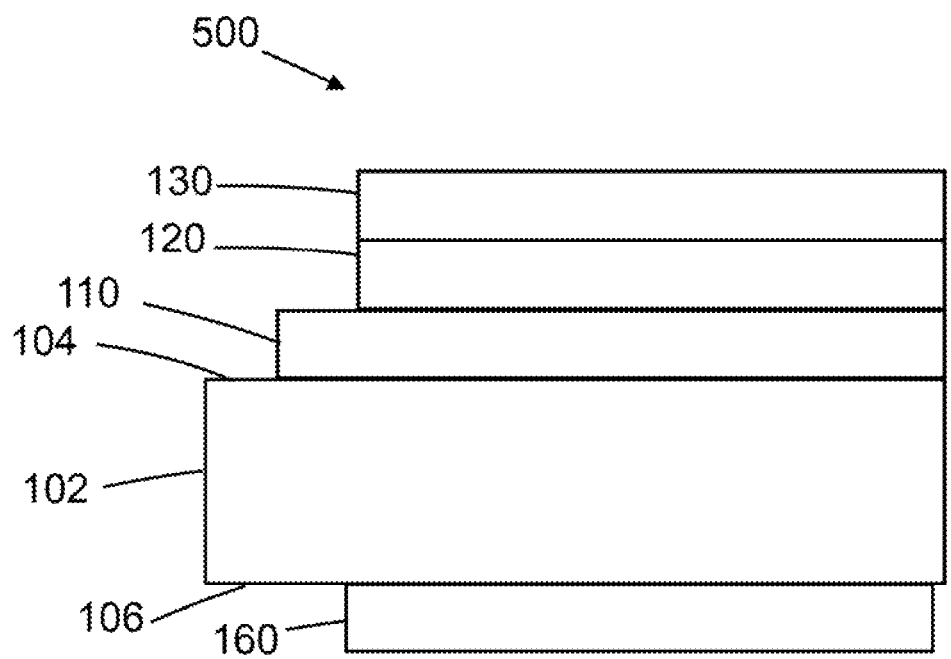
FIG. 5 is a side view of another example of the assembly as described herein.

An antenna 160 can be located on side 106 of substrate 102 opposite side 104 adjacent to coil 120, as shown in FIG. 5.

Figure 6:
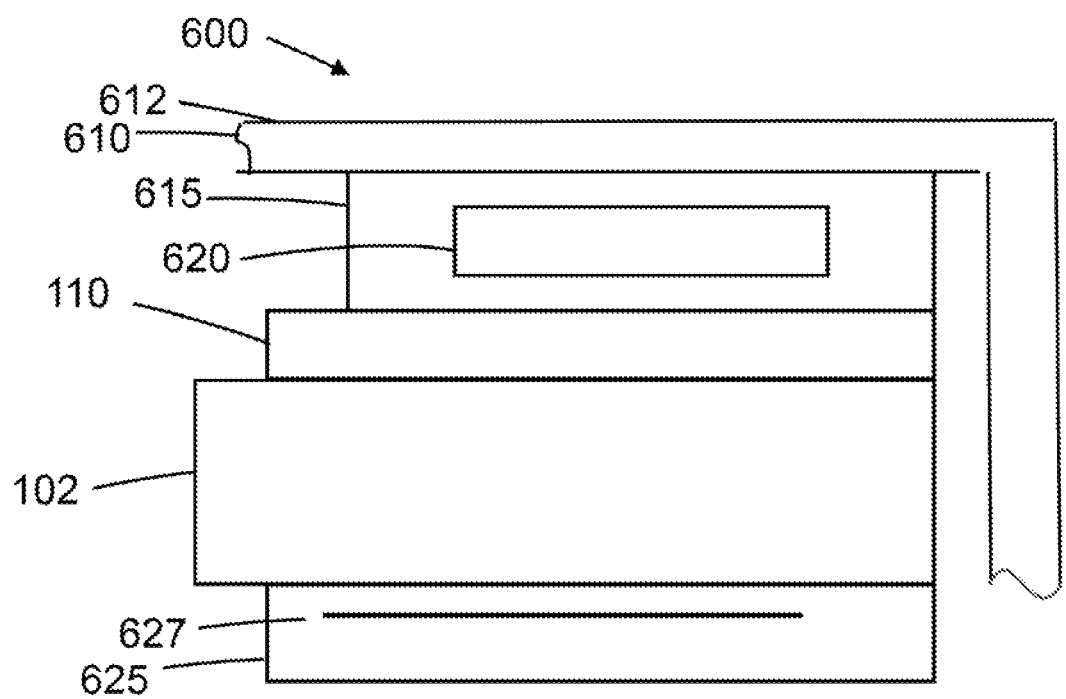
FIG. 6 is a side view of the portable electronic device as described herein.

Referring now to FIG. 6 a portable electronic device is shown generally at 600. The portable electronic device 600 includes a housing body 610 having an exterior surface 612. An electronic component 615 is disposed within the housing body 610 adjacent the exterior surface 612. The electronic component 615 includes a coil 620 which is at least one of a receiver coil or a transmitter coil for a charging unit. The electronic device 600 includes a graphite substrate 102 having a surface with a magnetic coating 110 proximate the electronic component 615, the magnetic coating facing the electronic component. The device 600 further includes a second component 625 which includes a metal member 627, wherein the graphite substrate 102 faces the second component.

The graphite 102 and coating 110 provides a lossy absorber and thermal properties to lower the Q factor of the resonant cavities or in other words reducing the voltage standing wave ratio (VSWR) at specific points within a device thereby providing an EMI/ESD solution. Graphite's ability to conduct heat effectively also enables it to act as a thermal solution.

Currently there are variety of lossy absorbing materials, but there is a compromise between the electromagnetic (EM) absorption and thermal management. A composite with graphite powders and/or additional fillers or compressed exfoliated graphite flakes provides microwave (MW) absorption at higher frequencies (>1 GHz) and proper thermal management for resolving issues with cavity resonances in devices. Graphite materials with an embodiment of the afore noted magnetic coatings may have thermal management advantages over currently available materials along with at least one or more of the additional advantages of signal absorbing, signal reflecting or magnetic flux managing.

The coated graphite assembly absorbs microwave frequencies by incorporating a magnetic filler in the form of magnetic flakes such as Sendust (a composite of iron, silicon and aluminum; one embodiment being 85% iron, 9% silicon and 6% aluminum by weight), carbonyl iron powder (CIP) or particles such as ferrite, and iron silicide powders with graphite The composite may be formed by, but not limited to, by inserting these substances in exfoliated graphite (EG) with a resin or binder. In another example, magnetic filer substances are inserted in exfoliated graphite (EG) without a resin and without a binder.

The combination of graphite layer 102 and magnetic coating 110 will spread heat from the coil and may direct a magnetic field generated by the transmitting coil to the intended receiving coil while avoiding/minimizing stray radiation from escaping to interfere with the functioning of other components of the device.

Fast wireless charging of mobile devices will enable wider adoption in both the consumer electronics and medical device markets. Wireless charging has already started the transition from novelty to commercial availability, however, the device still charges significantly slower than its wired counterparts one reason being it receives significantly lower power. This translates into more than three hours to charge a battery as compared to the plugged-in 15 W "fast-charge" which charges in less than 1.5 hours. An embodiment of a graphite wireless charging assembly using graphite sold under the trademark eGRAF® GRAFARMOR™ magnetic flux managing material (from Advanced Energy Technologies LLC, a subsidiary of GrafTech International Holdings Inc.) takes advantage of being tune-able to both the induction and resonant charging frequencies, making it compatible to both close-coupled and long distance charging. The slim form factor of the GRAFARMOR™ solution will enable it to be used on receiving coils in a handheld device. The GRAFARMOR™ solution can be used to charge a device in less than 2 hours.

Broadband Shielding

An embodiment of a hybrid solution disclosed herein has the high conductivity of metals and broadband shielding effectiveness of graphite based materials. Graphite based solutions have a larger skin depth than metals that results in optimized/improved shielding performance at higher frequencies approximately >10 GHz (depending on metal type) as compared to metal foils. An example of a preferred frequency may be up to 100 GHz. Another embodiment disclosed herein may include a mesh substrate incorporated into one (1) or more graphite layers. A material of construction for the mesh may vary depending on the application. In one instance the mesh may be constructed from one or more types of metal such as but not limited to stainless steel, aluminum, copper, steel, silver nanowire, alloys thereof and any combination thereof. In addition or in place of the metal mesh, polymeric or carbon fibers may be used to make part or all of the mesh. The metal and/or the fibers may have any desired coating on their exterior.

A desirable embodiment may be a lightweight shield that is easily moldable into complex shapes and conductive surfaces or regions. Conductivity regions and directions can be selective and adjusted based on design criteria and application.

An example of preferable properties for the mesh include a heat resistance of at least 1,000° C.; and an 80 dB shielding rating up to at least 1 GHz, preferably at least 2 GHz.

Physical properties of the mesh may be adjusted to form the assembly of the mesh and the graphite as desired. For example, the size openings of the mesh may range from a 100 microns up to 5 mm. The thickness of the strands used to form the mesh may vary from 10 microns up to 1 mm.

The mesh may be incorporated into one or more layers of graphite, the graphite may include at least one of compressed particles of exfoliated graphite, graphitized polymers and a combination thereof. The thickness any individual layer of graphite may range from 17 microns up to about 500 microns. The density of the individual layers of graphite may range from about 0.2 g/cc up to about 1.9 g/cc. In the case of the embodiment being formed from more than one graphite layer, the different graphite layers may be formed from the same or different starting materials, the graphite layers may have the same or different thicknesses and the graphite layers may have the same of different densities.

One technique that may be used for incorporating the mesh into the graphite layer may be cold rolling such as calendaring. In this embodiment, the combination of the mesh and the one or more graphite layers are aligned together and run through a pair of calendaring rollers. The calendaring rollers are separated by a predetermined distance to achieve a target thickness for the assembly of the mesh and the graphite. A second technique that may be used may include pressing. In this embodiment, the aligned combination of the mesh and the graphite are placed in a press and the platen are applied to the combination.

One technique that may be used to make the broadband shielding article includes co-calendaring the mesh article and a mass of graphite. The mass may be in the form of sheets of graphitized polymer, compressed particles of exfoliated graphite and combinations thereof. Preferably the sheets have a density of less than 1.8 g/cc to as low as 0.1 g/cc. This density disclosure is intended to include all densities between 0.1 to 1.8 g/cc. In particular embodiments, the graphite mass has a density of less than 1.2 g/cc. Regarding the amount of graphite, preferably, the mass of graphite has a thickness at least equal to 0.8 times the thickness of the mesh, in other examples the mass of graphite has a thickness at least equal to 0.5 times the thickness of the mesh. In preferred embodiments, the graphite mass may have a thickness of 0.9 times the thickness of the mesh or more; in a more preferred embodiment, the ratio of thickness between the graphite and the mesh is 1:1. The upper end regarding the thickness of the mass of graphite may be established by the thickness of a continuous graphite layer desired in the final article. As for a minimum amount of graphite, it is preferred that at least enough graphite is used to fill the openings in the mesh.

In a particular embodiment of the method, it is preferred that the mass graphite is not located on both sides of the mesh as the graphite and the mesh enter the calendaring station. In another embodiment, graphite may be located on each side of the mesh as the materials enter the calendaring station.

Standard thickness for the finished assembly may range from about 50 microns up to about 500 microns. The density of the final assembly may range at least 2.0 g/cc up to about 5.0 g/cc. The in-plane thermal conductivity of the assembly may range from about 50 W/mK up to bout 1,000 W/mK. A preferred shielding effectiveness is a level of at least 80 dB for the assembly across the frequencies of 1 KHz up to about 10 GHz.

Figure 13A:
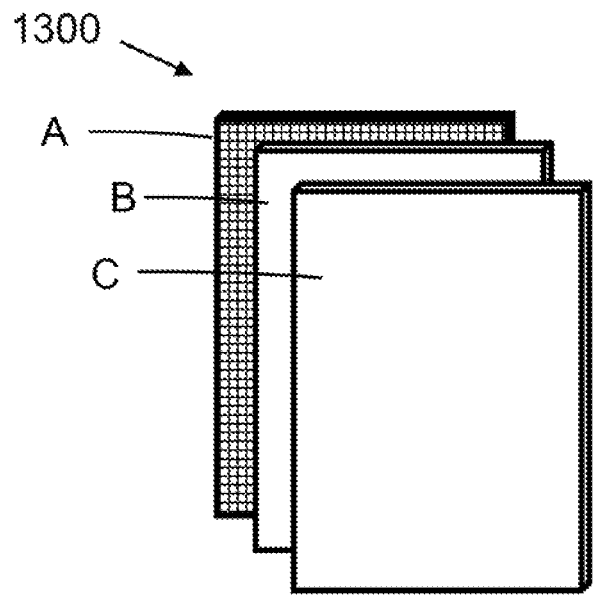
FIG. 13a is a schematic view of an embodiment illustrating materials that may be used to create a broadband shielding article.
Figure 13B:
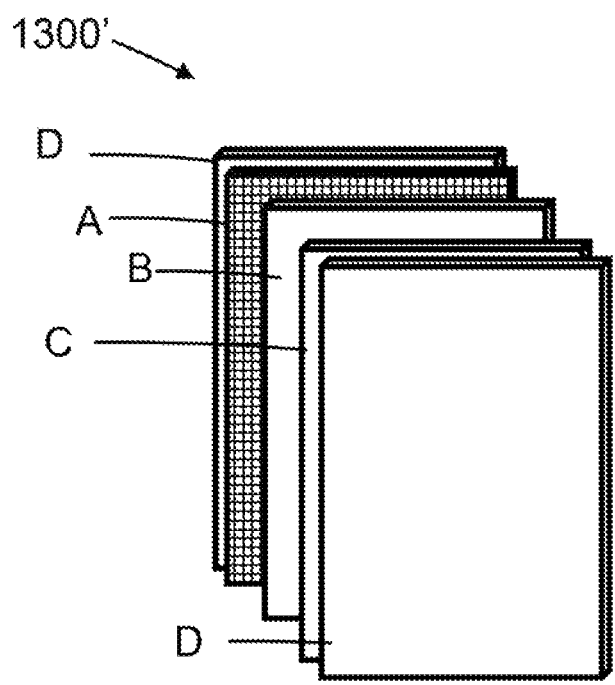
FIG. 13b is a schematic view of another embodiment illustrating materials that may be used to create a broadband shielding article.

Various concepts regarding the broadband shielding articles are disclosed in FIGS. 13-26. Illustrated generally at 1300 in FIG. 13 are materials that may be used to make the broadband shielding articles disclosed herein. Material A is a view of a mesh material, items B and C are examples of graphite materials that may be used. Item B is a sheet of compressed particles of exfoliated graphite and item C is a sheet of graphitized polymer. The description herein regarding the mesh article is applicable to mesh A.

The finished article 1300 made from the materials may include one (1) or more sheets of mesh A as desired. The finished article 1300 may include more than one type of mesh material if so desired; equally the mesh material in the finished article may have differing sizes as desired. Any number of graphite sheets B, C may be used to make the finished article 1300. The finished article 1300 may include one or both types of the aforementioned types of graphite B, C.

In another embodiment, assembly 1300' may include an exterior protective coating D on one or both major surfaces of a finished article of assembly 1300'. The protective coating D may be any material that will inhibit flaking of the graphite layer. An optional second function of the protective coating D is that it may electrically isolate the finished article. Non-limiting examples of suitable materials for the protective coating may include polyimide or PET.

Assembly 1300, 1300' can include one (1) or more graphite layers. Assembly 1300, 1300' is not limited to any number of graphite layers. Suitable types of graphite may include compressed particles of exfoliated graphite, graphitized polymer and combinations thereof. Preferably, the graphite layer B, C is in the form of a sheet. The above disclosure regarding thickness of the graphite layer B, C is equally applicable to the embodiments illustrated in FIGS. 13a-26. In a particular embodiment, preferably, the graphite layer B, C has a thickness of no more than 100 microns.

Exemplary materials for mesh A may be composed of aluminum, brass, columbium, copper, gold, Inconel, nickel, nickel alloys, phosphor, bronze, platinum, silver, stainless steel, low carbon steel, tantalum, titanium, zinc, zirconium, PEEK, PTFE, PFA, ECTFE, polypropylene, polyethylene, PET and combinations thereof. The mesh A may be formed of expanded material such as expanded metals or expanded plastics. Suitable samples of the mesh A may have a standard diamond shape and the mesh sizes range from 0.416" to 0.002". A number of openings per square inch can vary from 25 to as many as 11,000, with an open area from 95% to as low as 10%.

Preferably each strand of the mesh A has a nominal original thickness of no more than 5 mils. Suitable original thickness include 5 mils to 0.5 mils and all thicknesses in between. The actual strand width may range from 8 mils or less. Suitable actual strand width may range from 8 mils to 0.5 mils and all thicknesses in between. The length of the major opening of the mesh may be no more than 0.5". Examples suitable lengths of the major opening may be any distance between 0.5" to 0.02".

Two examples of suitable meshes are 2Cu4-050 and 1.5Cu5-050. The first number corresponds to the nominal original thickness, the letters represent the material of construction, the second number represents the actual width strand and the third number represents the length of the major opening of the mesh. All numbers are given in mils. The above examples are example of expanded mesh. Preferably the nominal original thickness is 3 mils or less.

Another option with the expanded mesh is that the mesh may be flattened or non-flattened. In particular embodiments, the non-flattened mesh may be preferred.

Another type of suitable mesh includes a woven mesh. The woven mesh typically has an opening size of 0.006" or less. Examples of suitable nominal mesh sizes include 0.0059" (100 mesh) 0.0049", Examples of suitable woven meshes include stainless steel (such as but not limited to an Aaronia Mesh, 316 stainless steel, 304 stainless steel), aluminum and alloys thereof, copper, and combinations thereof.

Figure 14:
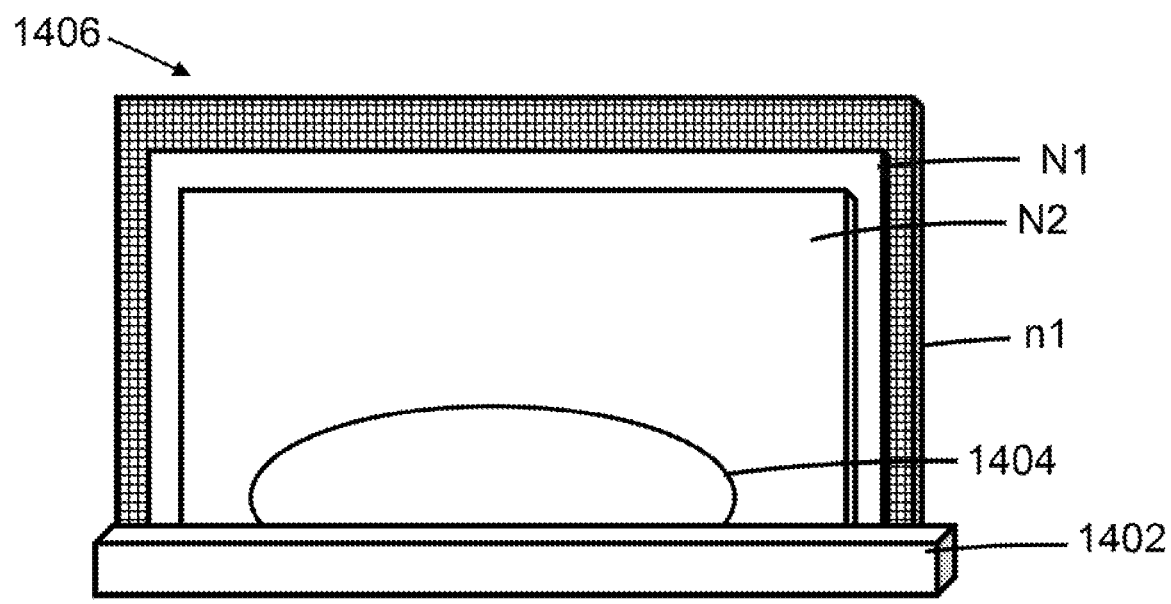
FIG. 14 is a schematic view of an embodiment of a broadband shield forming a cage around a source of radiation.
Figure 15:
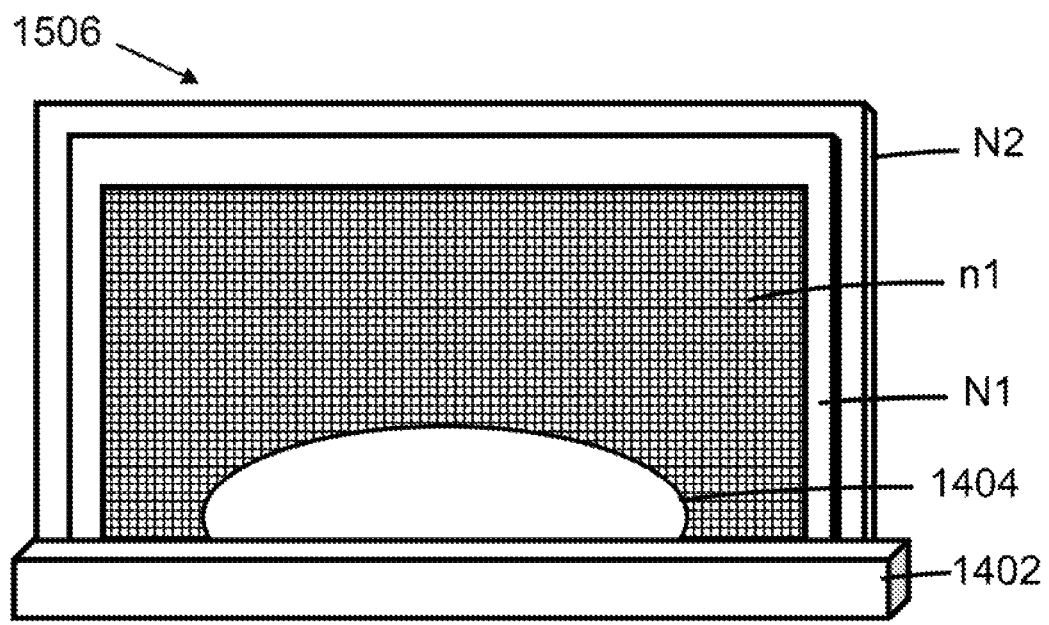
FIG. 15 is a schematic view of another embodiment of a broadband shield forming a cage around a source of radiation.
Figure 16:
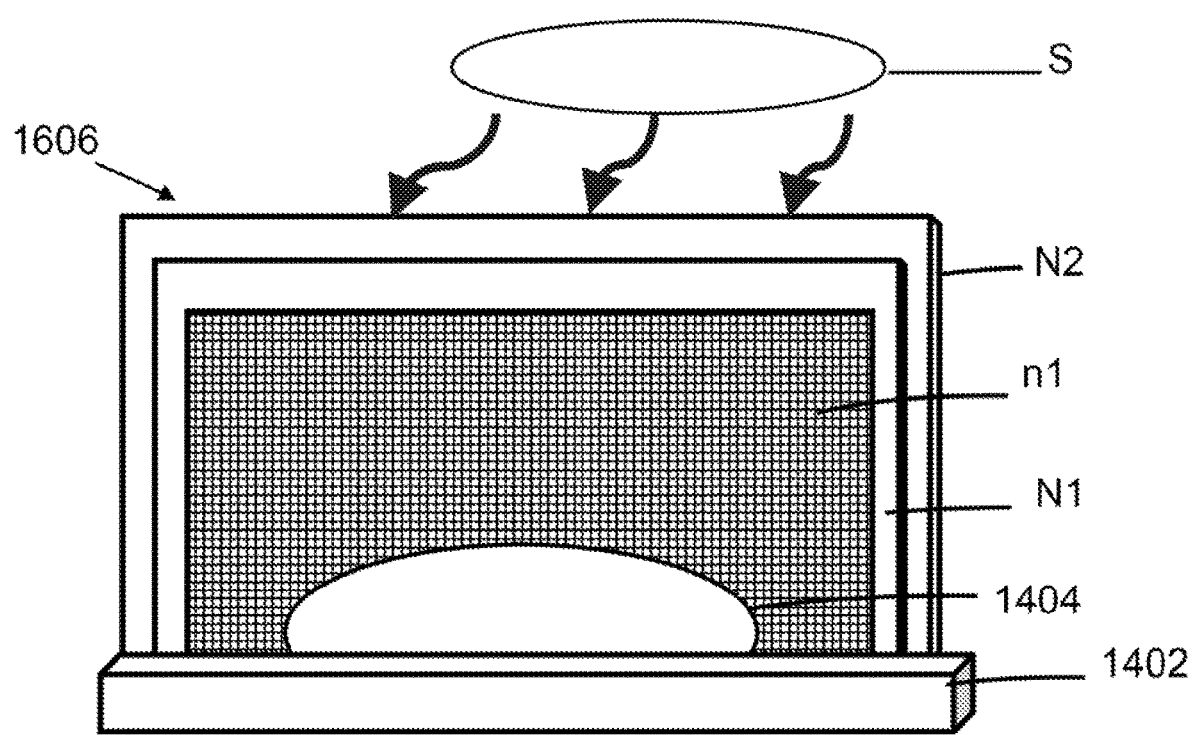
FIG. 16 is a schematic view of an embodiment of a broadband shield forming a cage which shields a sensitive component from one or more external sources of radiation.

Various embodiments of this concept are illustrated in FIGS. 14-16. In each embodiment, the printed circuit board is illustrated as element 1402. The electronic component which is being shielded or electronically isolated is shown as element 1404. The electronic component may include one (1) more components. As shown in FIGS. 14-16, element 1404 may be enclosed by circuit board 1402 and finished article 1406, 1506 and 1606 respectively. Finished article 1406 includes an exterior mesh n1 and intermediate layer of compressed particles of exfoliated graphite N1 and an interior graphite layer of graphitized polymer N2. In this embodiment, it is preferred that graphite N1 extends through the openings of the mesh. If so desired, the graphite N1 may form an exterior facing surface on the mesh. Such exterior surface being opposed to element 1404.

FIG. 15 is the same as that of FIG. 14, except that the orientation of the finished article 1506 relative to that of

1406. In FIG. 15, the finished article 1506 includes the mesh n1 closest to the element 1404 and the graphite layers N1 and N2 are positioned exterior to the mesh, with N2 forming the exterior of the finished article. The embodiment in FIG. 16 differs from that of FIG. 15, in that the element 1404 is being shielded from interference by radiation sources S external to assembly 1606, such as electrostatic discharges, lightning strikes, other electronic components, or any other external radiation source.

In the case that the graphite layer is in close proximity of component of interest (for example integrated circuit component) this would enable more efficient heat spreading, on the embodiments with the mesh side closet to the component of interest would enable better in-plane electrical conductivity.

If so desired, the mesh may be located in the center of the finished article, encased in graphite.

Figure 17:
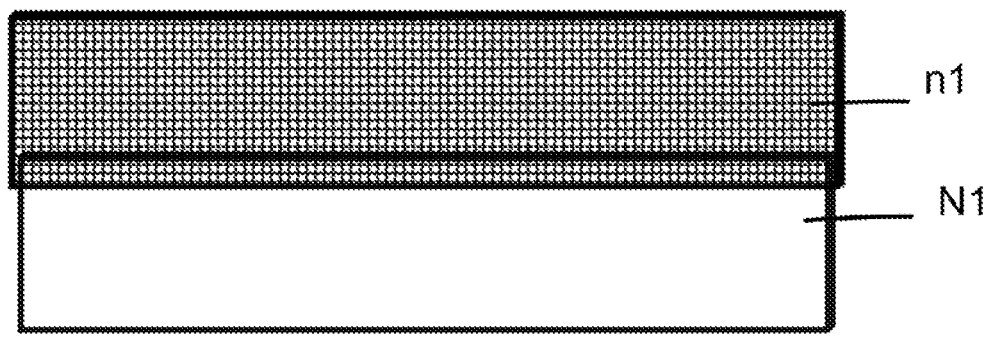
FIG. 17 is a schematic view of an embodiment of a broadband shield disclosed herein.
Figure 18:
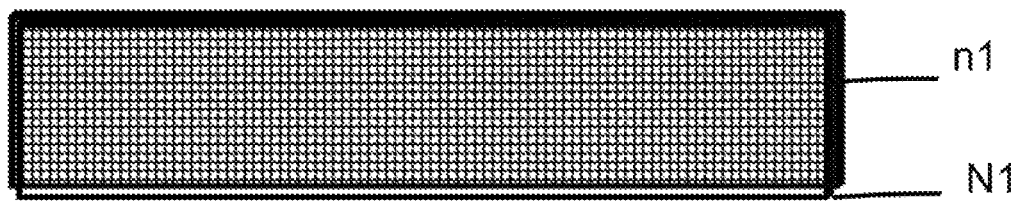
FIG. 18 is a schematic view of another embodiment of a broadband shield disclosed herein.

FIGS. 17-23 are examples of alternative embodiments of the broadband shielding article that are disclosed herein. FIGS. 17-20 illustrate that the surface area ratio of graphite to mesh may range from 1:1 to 1:100 or 1:1 to 100:1. As shown in FIGS. 17 and 18, the graphite N1 and the mesh n1 have substantially the same surface area. In the FIG. 17 embodiment, the mesh n1 and the graphite N1 only overlap each other by about ten (10%) percent. In FIG. 18, the mesh n1 and the graphite N1 overlap each other up to about one-hundred (100%) percent. All percentages in between ten percent and one hundred percent are contemplated herein.

An interesting embodiment includes the overlap being over ninety (90%) percent but less than one hundred (100%) percent. In the case of a metal mesh, the non-overlapped portion of the metal mesh may be used for soldering the finished article to another component.

Figure 19:
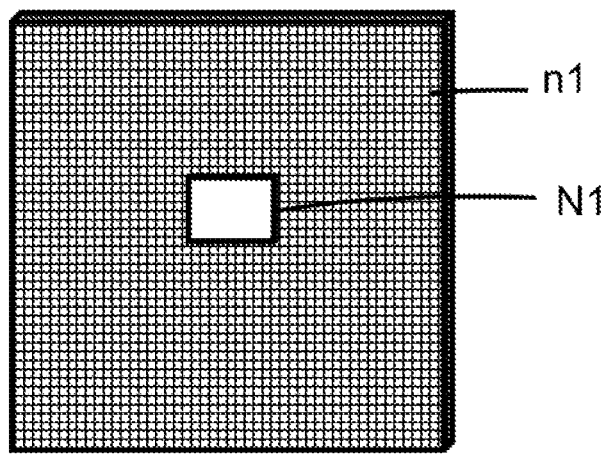
FIG. 19 is a further embodiment of a broadband shield disclosed herein.
Figure 20:
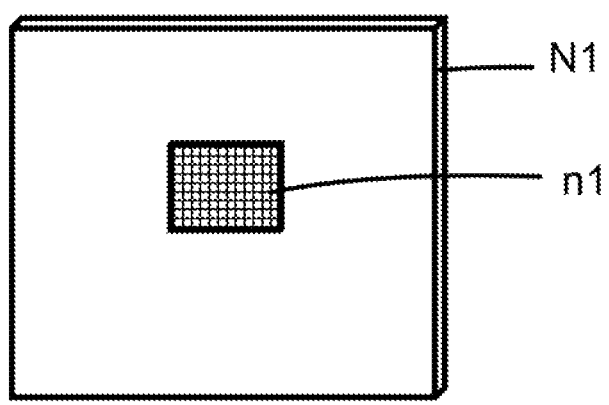
FIG. 20 is a further embodiment of a broadband shield disclosed herein.

FIGS. 19 and 20 illustrate the above ratio of mesh to graphite and vice versa. The minor component of the ratio may be located symmetrically to the major component; alternatively the minor component may be located asymmetrically to major component. Minor component is used in this section to mean either the mesh n1 or the graphite N1 is less than the 100 and the component which makes up the 100 of the ratio is the major component. Thus, in FIG. 19, the graphite N1 is the minor component and the mesh n1 is the major component. In FIG. 20, the graphite N1 is the major component and the mesh n is the minor component.

Exemplary applications for the above include the following, if the mesh is the major component, the article may be used to transmit or receive an external signal. In the case of the graphite being the major component, the finished article may have uses for preferred heat spreading/thermal interface, thermal shielding, apart from EMI shielding.

Figure 21:
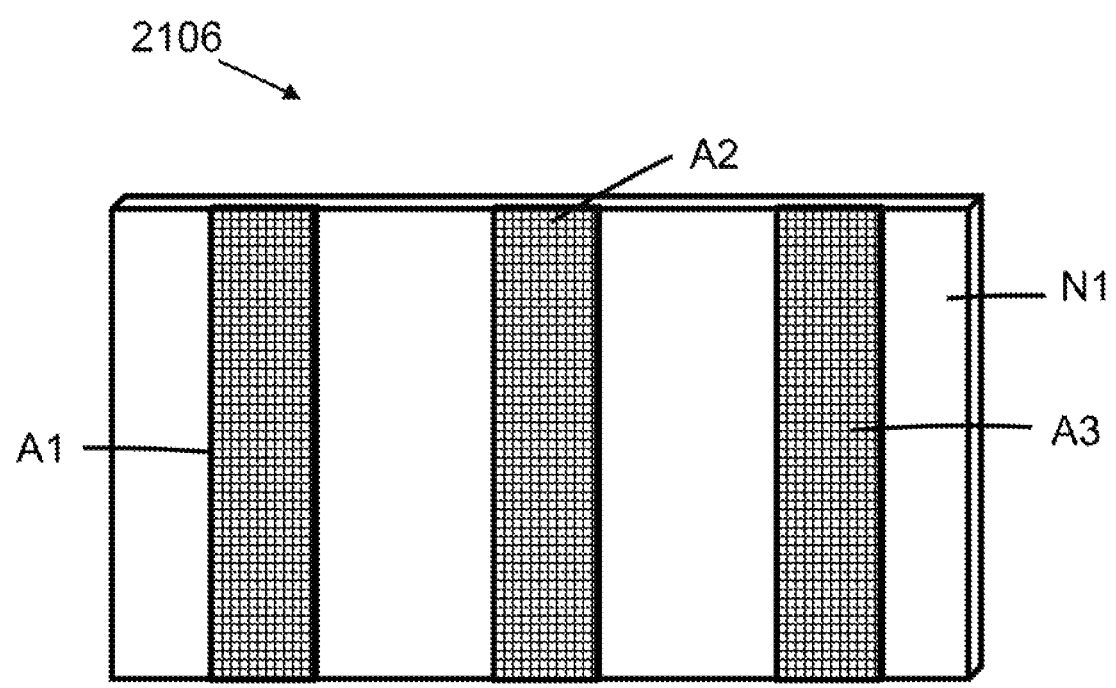
FIG. 21 is a further embodiment of a broadband shield disclosed herein.

FIG. 21 is another alternate embodiment of the finished article shown generally at 2106. In this embodiment, different meshes of different materials are aligned with different portions of the graphite N1. In this non-limiting example, three (3) distinct meshes are used, including a first mesh A1 formed of copper, a second mesh A2 formed of PEEK, and a third mesh A3 formed of stainless steel. However, this embodiment may include any number of meshes. As shown, the article 2106 may include one or mom portions which only include graphite N1.

Figure 22:
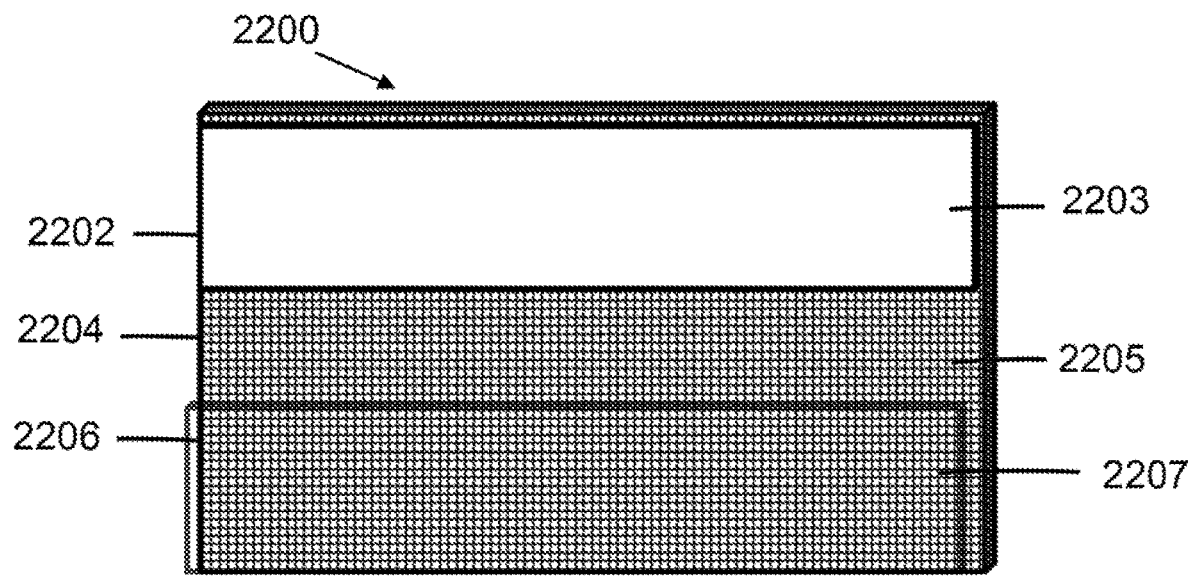
FIG. 22 is a further embodiment of a broadband shield disclosed herein.

FIG. 22 further includes an embodiment of an article shown generally at 2200, in which the graphite is varied. As shown in article 2200, a top section 2202 includes graphite 2203 forming an exterior surface, a middle section 2204 includes mesh 2205 forming an exterior surface and bottom section 2206 includes graphite 2207. Graphite 2202 and graphite 2207 may be the same graphite, or different graphite formed of different materials, or graphite 2202 and 2207 may be different in one or more properties.

Figure 23:
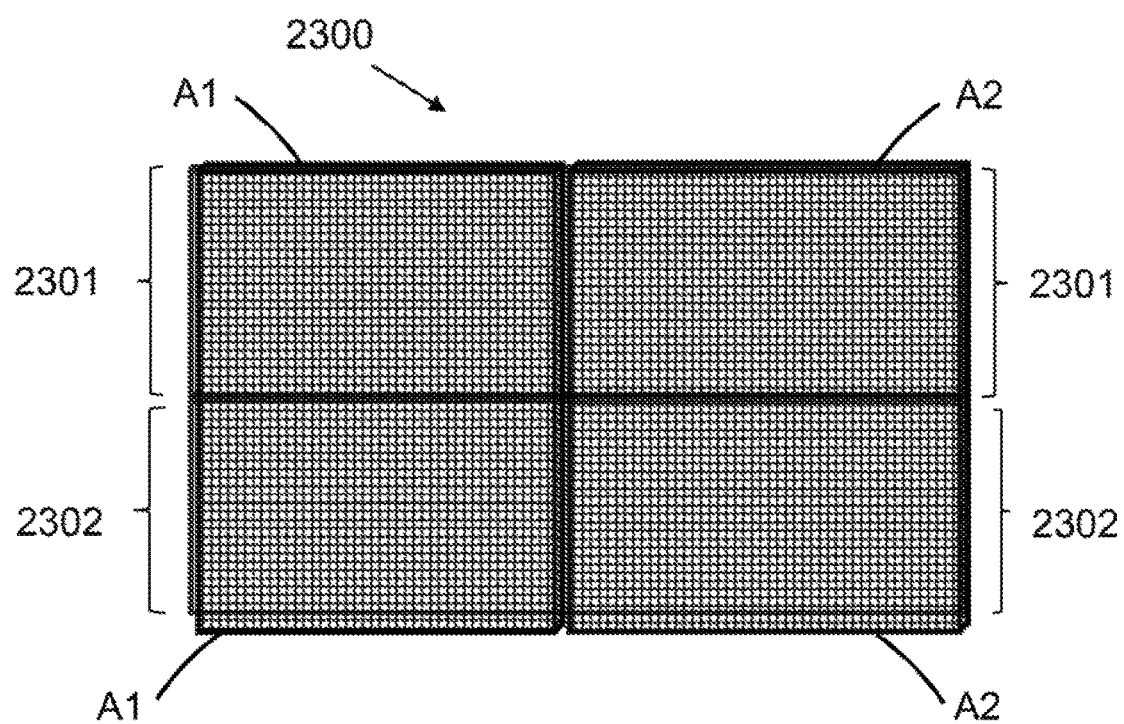
FIG. 23 is a further embodiment of a broadband shield disclosed herein.

FIG. 23 illustrates another embodiment of a finished article shown generally at 2300. Article 2300 differs from article 2200 in that article 2300 includes two (2) different types of meshes A1 and A2 combined with two (2) types of graphite 2301 and 2302. As shown in FIG. 23, the article 2300 includes each combination thereof, including graphite 2301 and mesh A1, graphite 2302 and mesh A1, graphite 2301 and mesh A2, and graph 2302 and mesh A2.

Figure 24:
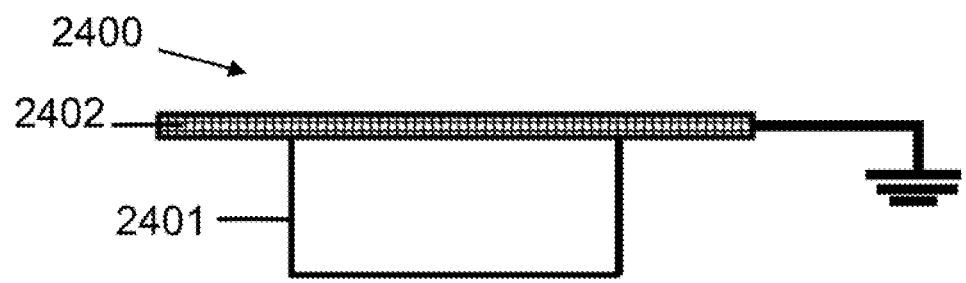
FIG. 24 illustrates an application of the broadband shield disclosed herein.
Figure 25:
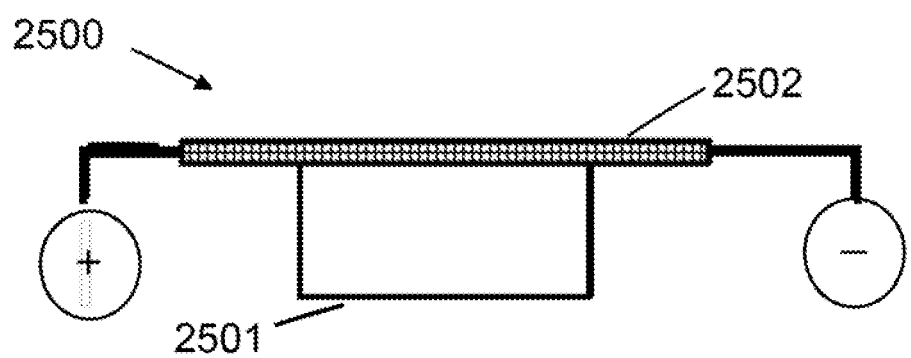
FIG. 25 illustrates an application of the broadband shield disclosed herein.
Figure 26:
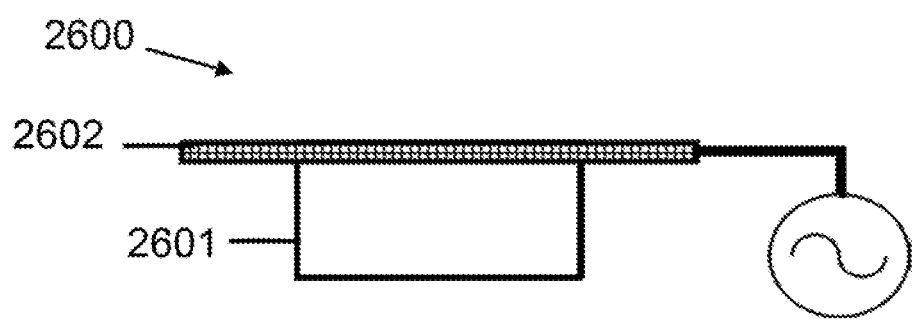
FIG. 26 illustrates an application of the broadband shields disclosed herein.

FIGS. 24-26 address various applications. In FIG. 24, a finished article shown generally at 2400 includes graphite 2401 as described above, and a mesh portion 2402 attached to a ground plane. In contrast, in FIG. 25, a mesh portion 2502 of the finished article 2500 is connected to a DC power source. In FIG. 26, the mesh portion 2602 of finished article 2600 is connected to an AC power source (FIG. 26).

For all of FIGS. 14-26, any desired combination of mesh and graphite may be used to practice the described embodiments as well as other embodiments that may be conceived.

In various broadband shielding embodiments disclosed herein, the graphite article may have an in-plane thermal conductivity of at least 700 W/mK, preferably at least 750 W/mK and a through plane thermal conductivity of at least 50 W/mK, preferably at least 70 W/mK and more preferably at least 100 W/mk.

A particular finished embodiment of interest is the finished article having a thickness of no more than 100 microns, preferably less than 100 microns. Examples of thickness of graphite/mesh articles which may be formed include finished articles having a thickness of no more than 80 microns for a first embodiment and no more than 60 microns for a second embodiment. Preferably, each of these articles have a density of more than 1.4 g/cc. A third embodiment, the finished article may be no more than 40 microns thick. If so desired, the finished article may be binder free.

If so desired, the finished article may have a thickness up to 1 mm. Such articles will typically have a density of at least 1.4 g/cc.

The in-plane thermal conductivity of the article may range from about 300 to about 800 W/mK, preferably 500-800 W/mK. If graphitized polymer is used as the graphite source, the in-plane thermal conductivity will typically be in the range from about 700-800 W/mK, preferred embodiments 750-800 W/mK. Typical through plane thermal conductivities will range from about 50-125 W/mK.

Preferably, the various broadband shielding articles are monolithic articles.

The broadband shielding articles may have applications in devices which require electromagnetic interference (EMI) shielding. In one advantageous embodiment, the article may have flexibility that resists cracking upon bending of less than 90°. Preferably, the mesh of the article described herein is resilient, electrically conductive and encased (also referred to as embedded or encapsulated) in the graphite. A specific example of such application is as an EMI gasket.

Other application for broadband shielding include consumer electronics, especially shielding of high speed integrated circuits (IC), such as for example board level shields, shielding enclosures for sensitive components in the automotive or telecommunication industry with a wide range of frequencies for today's connectivity purposes. The embodiments disclosed herein may provide benefits for aerospace with attributes of lightweight, non-corrosive high frequency shielding materials, military (e.g., stealth technology) and electromagnetic pulse (EMP) protection.

The broadband shielding articles described herein may be used as a partial or total substitute for metal foils or sheets, board level shields, conductive tape or adhesives, metalized fabrics, vent panels, etc. The shielding articles described herein will have good contact with adjacent surfaces to provide sealing and/or electrical conductivity between the adjacent surfaces. The surfaces can provide an enclosure for electronics packaging or an antenna mount.

An advantage of the above broadband shield is that it is not susceptible to galvanic corrosion. The shield also has improved resistance to pitting and crevice corrosion. It also has improved reliability in harsh environments as compared to conventional shields. Such shields also have the advantage of electrical continuity and may be soldered. Another advantage of the shield is that it has reduced reflectivity as compared to metal shields. Regarding absorption, the shield described herein will exhibit increased absorption as compared to conventional metal shields. Further, the shields may be used for grounding purposes.

The various embodiments disclosed herein may be practiced in any combination thereof.

Example

The invention disclosed herein will now further be described in terms of the below examples. Such examples are included herein only for exemplary purposes and are not meant to limit the claimed subject matter.

Shielding Effectiveness

Figure 7:
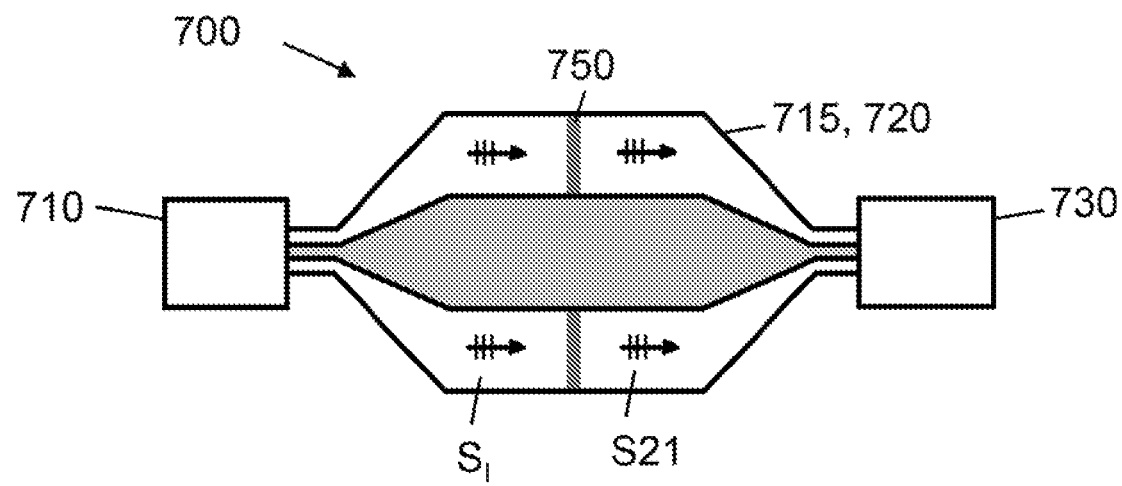
FIG. 7 is a schematic view of a signal shielding measurement system.

Shielding Effectiveness (SE) is calculated from transmission measurements in a 50Ω coaxial line at discrete frequency points based on ASTM D4935-99 using the testing apparatus of FIG. 7. The SE measurement system 700 includes a signal generator 710 (Rhode & Schwarz SMB100A), spectrum analyzer 730 (Rhode & Schwarz FSV30), and two different sized coaxial transmission lines 715, 720 (Electrometric EM2107 and Electrometric EM2108) to cover a broad frequency range. All components had a 50Ω characteristic impedance to prevent mismatch and calibration was performed prior to measurements.

SE was determined by applying a reference signal Sref to specimen test disks 750 thereby generating an incident plane wave $S_I$ impinging upon the test disk 750, some of which was transmitted through the test disk resulting in a transmitted plane wave S21 which is measured at 730. SE for specific materials was determined by comparing the signals S21 which were transmitted through them. Specifically, the SE of the GRAFARMOR™ material 920 was determined by subtracting the signal S21 transmitted through the GRAFARMOR™ material 920, referred to as S21GRAFARMOR, from the signal transmitted through a reference material, referred to as S21Reference.

$$SE = |S21|Reference - |S21|GRAFARMOR \qquad (1)$$

The reference specimen simulates the fixture 700 with no material present, while maintaining the same discontinuity in the transmission line. The test samples used were prepared in accordance with ASTM D4935-99 as cited above.

Figure 8:
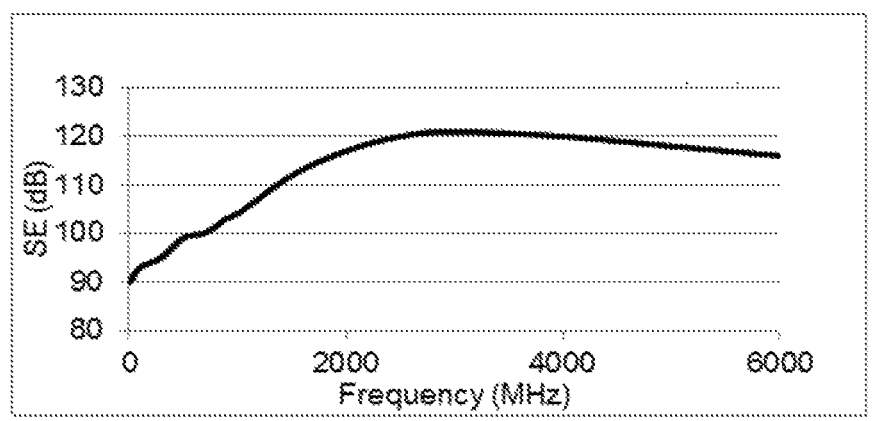
FIG. 8 is a graph of the shielding effectiveness ("SE") of an embodiment made in accordance with the subject described herein.

The SE curve for the GRAFARMOR™ article 920 is illustrated in FIG. 8. The result demonstrates the broadband shielding effectiveness of the GRAFARMOR™ article 920 from the kHz range through the low MHz range.

Absorption Power

Figure 9:
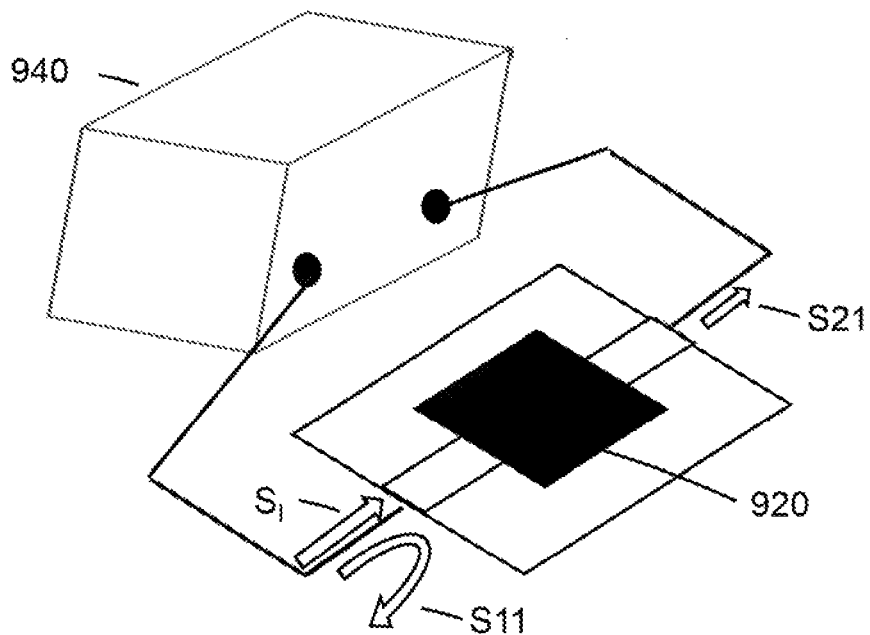
FIG. 9 is a schematic view of a microstrip test fixture.

The power loss or absorption power property was captured by a 50Ω Microstrip line 900 (MSL) based on IEC 62333-2 standard methodology. As the incoming wave $S_I$ interacted with the noise suppression material 920, it was partially transmitted S21, partially reflected S11 and partially absorbed, as shown in FIG. 9. The absorbed energy was converted to heat, the high thermal conductivity of the GRAFARMOR™ assembly managed the heat by spreading the thermal load over a wider area. Both ends of the MSL were connected to a vector network analyzer 940 (Agilent 8753D) through coaxial cables, with the initial impedance adjusted to 50Ω. The reflected signal S11 and transmitted signal S21 of the noise-absorbing sheet 920 were measured, the remaining energy was absorbed. The energy loss was expressed in the following equation.

$$\text{Absorption Power} = 1 - S11^2 - S21^2. \qquad (2)$$

Figure 10:
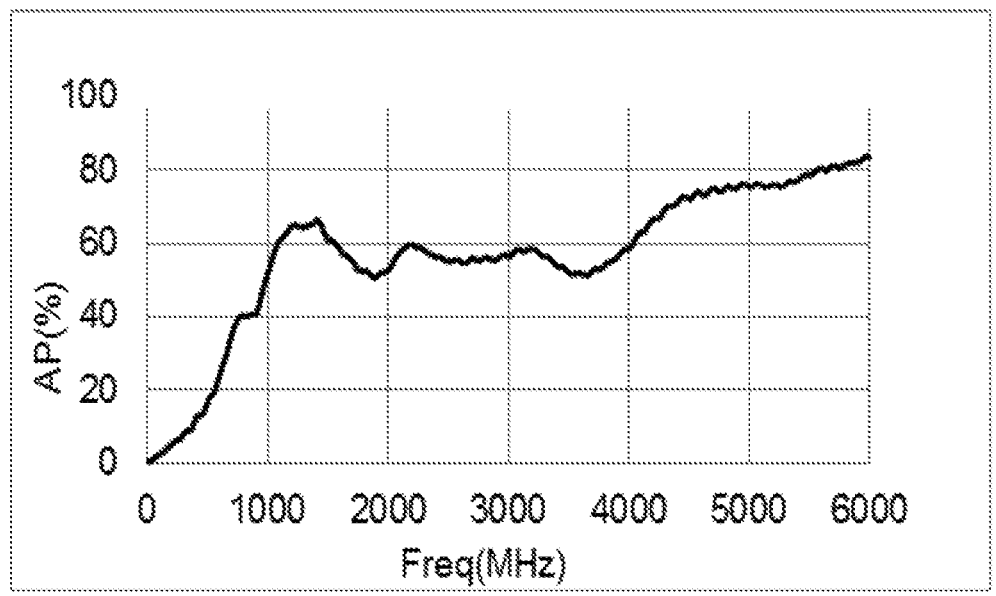
FIG. 10 is a chart of the absorption power of an embodiment for the assembly described herein.

The absorption power graph, FIG. 10, describes the percentage of total energy not transmitted or reflected at the described frequency. The GRAFARMOR™ solution displays good absorption over a wide frequency range.

Thermal Conductivity

Typically, noise suppression materials have poor thermal properties. The ability of the material to move heat away from the coil is advantageous to protect the electrical components and ensure a reasonable touch temperature on the outside of the device while it is charging. The published thermal conductivity value for a commonly available suppressor (NEC Tokin EFF Flex Suppressor) is 0.4 W/m K. The measured value for the GRAFARMOR™ article is about 180 W/m K. This enables the GRAFARMOR™ solution to move much more heat away from the coil to an open area in the device, protecting the surrounding electronics and reducing the external touch temperature. As more power is driven through the coil, more unwanted heat will be generated.

To quantify the ability of each material to spread heat away from the coil, thermal conductivity was measured using the LaserPIT from ULVAC-RIKO Corporation. Samples were cut into strips four (4 mm) millimeters wide and thirty (30 mm) millimeters in length. The materials were tested at a frequency of 0.1 Hz as the input signal propagated through the materials.

Figure 11:
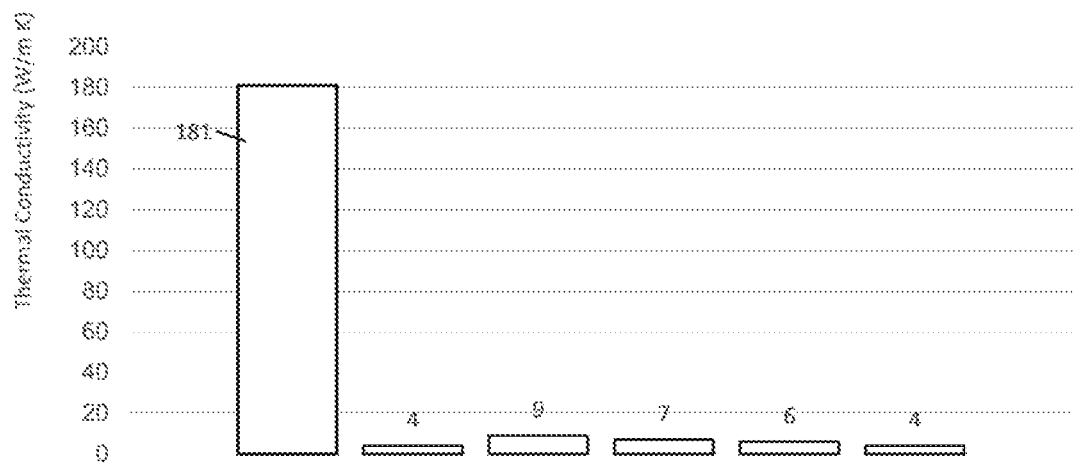
FIG. 11 is chart of the in-plane thermal conductivity of an assembly made in accordance with the subject matter described herein as compared to thermal conductivity of some competitive materials.

The diffusivity is measured with a LaserPIT instrument, which pulses a laser onto the top side of a thin sheet, and measures the temperature rise on the backside of it. A motorized stage moves the sample away from the laser source at a controlled rate. As the sample moves away, the rate at which the signal diminishes correlates to the thermal conductivity, or more precisely, the thermal diffusivity. The thermal conductivity is a product of the diffusivity, the density, and the specific heat (absorbed energy) of the material. FIG. 11 illustrates the performance difference between the GRAFARMOR™ solutions and commercially available materials.

Charging Speed Comparison 001341 The wireless charging system is a dual resonant frequency circuit, which implies that both the primary and the secondary form RLC series resonant circuits tuned to about the same natural frequency. The dual resonant circuit of the power receiver comprises the secondary coil and two resonant capacitances. The purpose of the first resonant capacitance $C_s$ is to enhance the power transfer efficiency. The purpose of the second resonant capacitance $C_d$ is to enable a resonant detection method. The relationship between resonance frequency and series capacitance is illustrated in equation (3) below, where $f_s$: resonant frequency, Ls: receiver self-inductance, Cs: series resonant capacitance.

$$f_s = \frac{1}{2\pi \cdot \sqrt{Ls \cdot Cs}}. \qquad (3)$$

Figure 12:
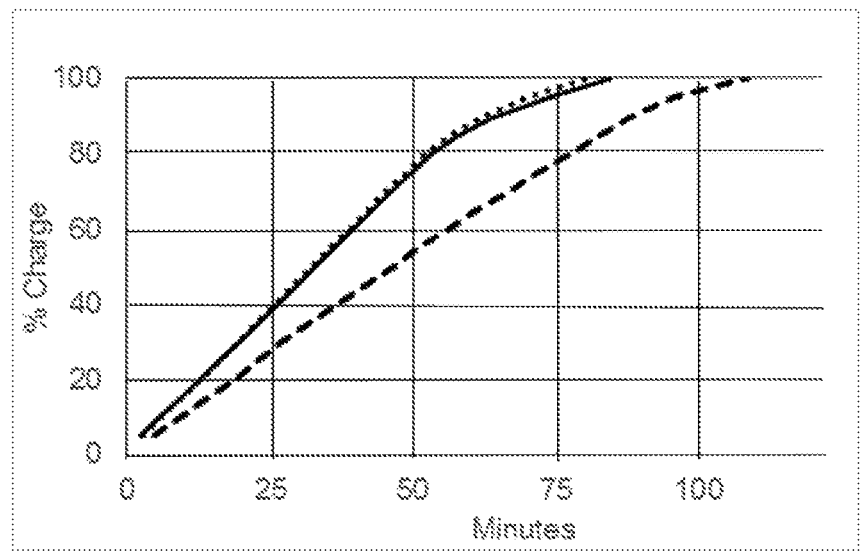
FIG. 12 is a chart of the charging speeds of an embodiment of wireless charging disclosed herein in comparison to wired charging and a control wireless charger.

GRAFARMOR™ materials can be tuned to the resonant frequency of interest to enable optimal efficiency. FIG. 12 shows the typical device, such as a mobile phone, charging cycle from <5% to 100% using a GRAFARMOR™ solution enabled device, Qi specification 8-watt wireless charger and a "fast-charge" wired charger ("control"). The GRAFARMOR™ test specimen charging cycle was performed using a custom built 15-watt wireless charger. This charger utilized the power port of the device in order to employ the device's internal protocols to protect the batteries. The key characteristic monitored was the rate of charge from <5% battery capacity to 100%. This data was collected using a charge data collection application on the mobile device. The rate of charging was calculated from the slope of the percent charge (%) verses time curve. The original manufacturer's solution was used as a baseline for comparison with the 8-watt wireless charger ("control"). The GRAFARMOR™ solution enabled 15-watt wireless system was as fast as the "fast-charge" wired charger, and nearly 29% faster than the currently available 8-watt wireless charger ("control").

Medium power fast wireless charging of handheld devices with speeds similar to a 15 W "fast-charge" wired charger was demonstrated. The GRAFARMOR™ solution containing charging units can be tuned to work with a wide variety of wireless power transmission standards from the low kHz to the low GHz range, enabling operations under multiple transmission frequencies. In contrast to currently available solutions, the GRAFARMOR™ based solution allows "fast-charging" without the need for additional thermal management solutions.

The charging speeds data shows the GRAFARMOR™ solution-containing device significantly outperformed the best commercially available Qi charging system and is on par with the fastest wired chargers. This opens up significant opportunities to bring wireless charging as the main charging mode in consumer electronics and enables true wireless medical devices. Additionally the GRAFARMOR™ based devices can fit into the existing form factors and thickness constraints of most current devices from smart phones to tablets to laptops and most medical devices.

The frequency ranges for the receiving coil may, in one example, range from about 80 kHz up to about 8 GHz. Particular preferred ranges may include 80-300 kHz and 110-205 kHz. Other examples of preferred ranges can include 80 to 330 kHz, 6.78 MHz to 13.56 MHz and 2.4 GHz to 2.48 GHz. Preferably the receiving coil 120 is capable of charging at a power level anywhere from 5-20 W.

This solution has radio frequency (RF) absorption properties in addition to intrinsic EMI shielding and thermal properties of flexible graphite, which is instrumental for the current generation of consumer electronics. Flexible graphite in the form of a heat spreader material is an excellent shield for electric/plane wave and by combining with the concepts described herein, it can be utilized for magnetic attenuation as well. In one example, the magnetic filler can be micron-sized. In another example, the magnetic filler can be nano-size.

All cited patents and publications referred to in this application are incorporated by reference in their entirety.

The invention thus being described, it will clear that it may be varied in many ways. Modifications and alterations will occur to others upon reading and understanding the preceding specification. It is intended that the invention be construed as including all such modifications and alterations insofar as they come within the scope of the appended claims or the equivalents thereof.

What is claimed is:

1. An assembly comprising:
a graphite substrate comprising one or more sheets of at least one of compressed particles of exfoliated graphite, a graphitized polymer and combinations thereof, the graphite substrate having a coated region located on at least one side of the graphite substrate, the coated region including a magnetic coating disposed on a surface of the graphite substrate, the magnetic coating having a thickness of more than 40 microns and no more than 300 microns;
an induction coil for wireless charging having an inwardly facing surface disposed adjacent the magnetic coating, the induction coil being capable of receiving a signal having a frequency of at least 80 kHz up to 8 GHz; and
a battery located on the side of the graphite substrate opposite the induction coil,
wherein the coated region is adapted to direct magnetic flux of the signal to the induction coil while the graphite substrate is adapted to shield the battery from the magnetic flux.

2. The assembly of claim 1 further comprising a protective coating disposed adjacent the magnetic coating on a side of the magnetic coating opposite the graphite substrate.

3. The assembly of claim 1 wherein the magnetic coating includes more than one layer.

4. The assembly of claim 1 wherein the graphite substrate is comprised of a sheet of compressed particles of exfoliated graphite, the sheet having a thickness of at least 40 microns, wherein the sheet has a major surface having a surface area greater than a surface area of the induction coil.

5. The assembly of claim 1 wherein the magnetic coating comprises at least two (2) layers, the first layer comprising a mixture of 25-75% by weight of magnetic shielding composition and 75-25% by weight of an absorbing compound.

6. The assembly of claim 5 wherein the first layer includes 40-60% by weight of the magnetic shielding composition and 60-40% by weight of the absorbing compound.

7. The assembly of claim 1 wherein the coating comprises no more than sixty percent by weight (60% pbw) of iron.

8. The assembly of claim 1 wherein the graphite substrate comprises less than five percent by mass of a binder.

9. The assembly of claim 8 wherein the binder is one of an elastomer and a resin.

10. The assembly of claim 1 wherein the graphite substrate is comprised of a sheet of graphitized polymers, the sheet having a thickness of at least 20 microns and an in-plane thermal conductivity of at least 300 W/mK.

* * * * *